(12) United States Patent
Hourani et al.

(10) Patent No.: US 11,837,644 B2
(45) Date of Patent: Dec. 5, 2023

(54) CONTACT OVER ACTIVE GATE STRUCTURES WITH METAL OXIDE-CAPED CONTACTS TO INHIBIT SHORTING

(71) Applicant: Intel Corporation, Santa Clara, CA (US)

(72) Inventors: Rami Hourani, Beaverton, OR (US); Richard Vreeland, Beaverton, OR (US); Giselle Elbaz, Portland, OR (US); Manish Chandhok, Beaverton, OR (US); Richard E. Schenker, Portland, OR (US); Gurpreet Singh, Portland, OR (US); Florian Gstrein, Portland, OR (US); Nafees Kabir, Portland, OR (US); Tristan A. Tronic, Aloha, OR (US); Eungnak Han, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 907 days.

(21) Appl. No.: 16/579,069

(22) Filed: Sep. 23, 2019

(65) Prior Publication Data

US 2021/0091194 A1 Mar. 25, 2021

(51) Int. Cl.
*H01L 29/423* (2006.01)
*H01L 29/78* (2006.01)
*H01L 23/522* (2006.01)
*H01L 29/417* (2006.01)
(Continued)

(52) U.S. Cl.
CPC .. *H01L 29/4238* (2013.01); *H01L 21/823418* (2013.01); *H01L 21/823431* (2013.01); *H01L 21/823468* (2013.01); *H01L 21/823475* (2013.01); *H01L 23/5226* (2013.01); *H01L 27/0886* (2013.01); *H01L 29/41775* (2013.01); *H01L 29/7851* (2013.01)

(58) Field of Classification Search
CPC .......... H01L 29/4238; H01L 29/41775; H01L 29/7851; H01L 27/0886; H01L 23/5226
See application file for complete search history.

(56) References Cited

U.S. PATENT DOCUMENTS

| | | | |
|---|---|---|---|
| 10,236,364 B1 * | 3/2019 | Cheng | H01L 29/456 |
| 2018/0286959 A1 * | 10/2018 | Wang | H01L 29/4232 |
| 2019/0164841 A1 * | 5/2019 | St. Amour | H01L 21/823807 |

* cited by examiner

*Primary Examiner* — Christine A Enad
(74) *Attorney, Agent, or Firm* — Schwabe, Williamson & Wyatt, P.C.

(57) ABSTRACT

Contact over active gate structures with metal oxide cap structures are described. In an example, an integrated circuit structure includes a plurality of gate structures above substrate, each of the gate structures including a gate insulating layer thereon. A plurality of conductive trench contact structures is alternating with the plurality of gate structures, each of the conductive trench contact structures including a metal oxide cap structure thereon. An interlayer dielectric material is over the plurality of gate structures and over the plurality of conductive trench contact structures. An opening is in the interlayer dielectric material and in a gate insulating layer of a corresponding one of the plurality of gate structures. A conductive via is in the opening, the conductive via in direct contact with the corresponding one of the plurality of gate structures, and the conductive via on a portion of one or more of the metal oxide cap structures.

19 Claims, 17 Drawing Sheets

(51) Int. Cl.
*H01L 27/088* (2006.01)
*H01L 21/8234* (2006.01)

US 11,837,644 B2

CONTACT OVER ACTIVE GATE STRUCTURES WITH METAL OXIDE-CAPED CONTACTS TO INHIBIT SHORTING

TECHNICAL FIELD

Embodiments of the disclosure are in the field of advanced integrated circuit structure fabrication and, in particular, contact over active gate structures with metal oxide cap structures to inhibit shorting and methods of fabricating contact over active gate structures with metal oxide cap structures.

BACKGROUND

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory or logic devices on a chip, lending to the fabrication of products with increased capacity. The drive for ever-more capacity, however, is not without issue. The necessity to optimize the performance of each device becomes increasingly significant.

Variability in conventional and currently known fabrication processes may limit the possibility to further extend them into the 10 nanometer node or sub-10 nanometer node range. Consequently, fabrication of the functional components needed for future technology nodes may require the introduction of new methodologies or the integration of new technologies in current fabrication processes or in place of current fabrication processes.

In the manufacture of integrated circuit devices, multi-gate transistors, such as tri-gate transistors, have become more prevalent as device dimensions continue to scale down. Tri-gate transistors are generally fabricated on either bulk silicon substrates or silicon-on-insulator substrates. In some instances, bulk silicon substrates are preferred due to their lower cost and compatibility with the existing high-yielding bulk silicon substrate infrastructure.

Scaling multi-gate transistors has not been without consequence, however. As the dimensions of these fundamental building blocks of microelectronic circuitry are reduced and as the sheer number of fundamental building blocks fabricated in a given region is increased, the constraints on the semiconductor processes used to fabricate these building blocks have become overwhelming.

DESCRIPTION OF THE EMBODIMENTS

Figure 2A:
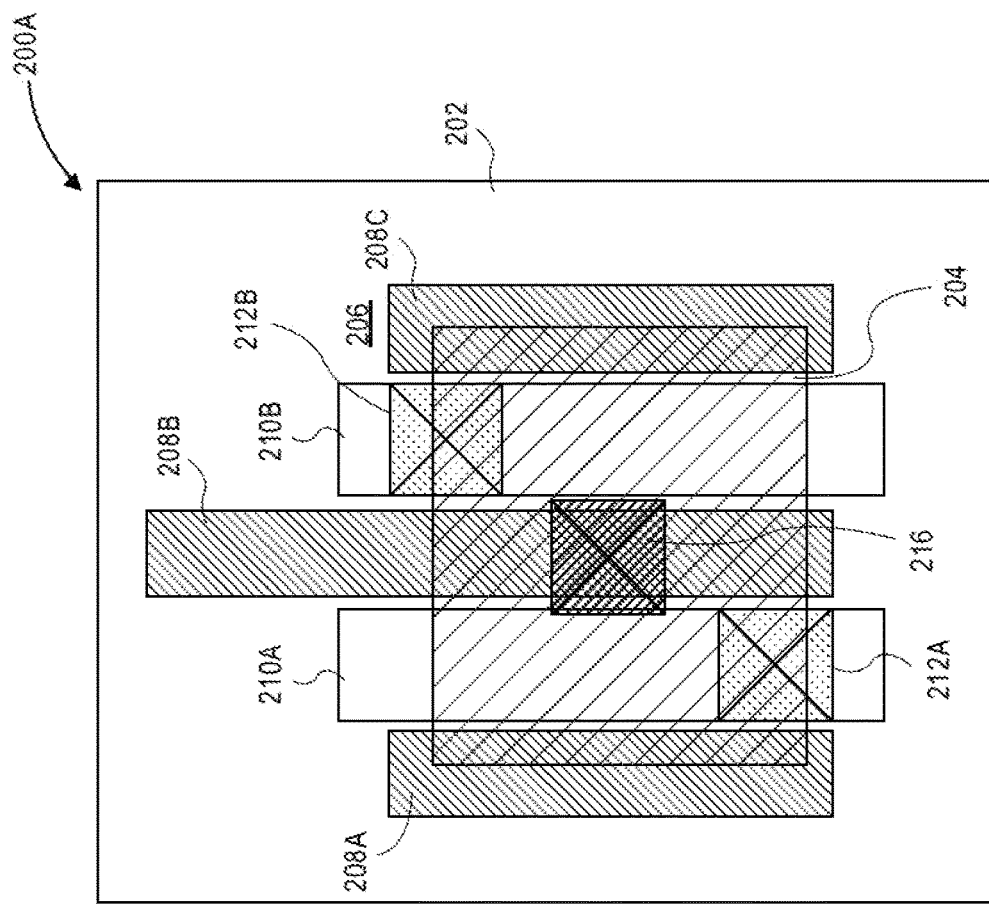
FIG. 2A illustrates a plan view of a semiconductor device having a gate contact via disposed over an active portion of a gate electrode, in accordance with an embodiment of the present disclosure.

Contact over active gate structures with metal oxide cap structures to inhibit shorting and methods of fabricating contact over active gate structures with metal oxide cap structures are described. In the following description, numerous specific details are set forth, such as specific integration and material regimes, in order to provide a thorough understanding of embodiments of the present disclosure. It will be apparent to one skilled in the art that embodiments of the present disclosure may be practiced without these specific details. In other instances, well-known features, such as integrated circuit design layouts, are not described in detail in order to not unnecessarily obscure embodiments of the present disclosure. Furthermore, it is to be appreciated that the various embodiments shown in the Figures are illustrative representations and are not necessarily drawn to scale.

The following detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

This specification includes references to "one embodiment" or "an embodiment." The appearances of the phrases "in one embodiment" or "in an embodiment" do not necessarily refer to the same embodiment. Particular features, structures, or characteristics may be combined in any suitable manner consistent with this disclosure.

Terminology. The following paragraphs provide definitions or context for terms found in this disclosure (including the appended claims):

"Comprising." This term is open-ended. As used in the appended claims, this term does not foreclose additional structure or operations.

"Configured To." Various units or components may be described or claimed as "configured to" perform a task or tasks. In such contexts, "configured to" is used to connote structure by indicating that the units or components include structure that performs those task or tasks during operation. As such, the unit or component can be said to be configured to perform the task even when the specified unit or component is not currently operational (e.g., is not on or active). Reciting that a unit or circuit or component is "configured to" perform one or more tasks is expressly intended not to invoke 35 U.S.C. § 112, sixth paragraph, for that unit or component.

"First," "Second," etc. As used herein, these terms are used as labels for nouns that they precede, and do not imply any type of ordering (e.g., spatial, temporal, logical, etc.).

"Coupled"—The following description refers to elements or nodes or features being "coupled" together. As used herein, unless expressly stated otherwise, "coupled" means that one element or node or feature is directly or indirectly joined to (or directly or indirectly communicates with) another element or node or feature, and not necessarily mechanically.

In addition, certain terminology may also be used in the following description for the purpose of reference only, and thus are not intended to be limiting. For example, terms such as "upper", "lower", "above", and "below" refer to directions in the drawings to which reference is made. Terms such as "front", "back", "rear", "side", "outboard", and "inboard" describe the orientation or location or both of portions of the component within a consistent but arbitrary frame of reference which is made clear by reference to the text and the associated drawings describing the component under discussion. Such terminology may include the words specifically mentioned above, derivatives thereof, and words of similar import.

"Inhibit"—As used herein, inhibit is used to describe a reducing or minimizing effect. When a component or feature is described as inhibiting an action, motion, or condition it may completely prevent the result or outcome or future state completely. Additionally, "inhibit" can also refer to a reduction or lessening of the outcome, performance, or effect which might otherwise occur. Accordingly, when a component, element, or feature is referred to as inhibiting a result or state, it need not completely prevent or eliminate the result or state.

Embodiments described herein may be directed to front-end-of-line (FEOL) semiconductor processing and structures. FEOL is the first portion of integrated circuit (IC) fabrication where the individual devices (e.g., transistors, capacitors, resistors, etc.) are patterned in the semiconductor substrate or layer. FEOL generally covers everything up to (but not including) the deposition of metal interconnect layers. Following the last FEOL operation, the result is typically a wafer with isolated transistors (e.g., without any wires).

Embodiments described herein may be directed to back end of line (BEOL) semiconductor processing and structures. BEOL is the second portion of IC fabrication where the individual devices (e.g., transistors, capacitors, resistors, etc.) get interconnected with wiring on the wafer, e.g., the metallization layer or layers. BEOL includes contacts, insulating layers (dielectrics), metal levels, and bonding sites for chip-to-package connections. In the BEOL part of the fabrication stage contacts (pads), interconnect wires, vias and dielectric structures are formed. For modern IC processes, more than 10 metal layers may be added in the BEOL.

Embodiments described below may be applicable to FEOL processing and structures, BEOL processing and structures, or both FEOL and BEOL processing and structures. In particular, although an exemplary processing scheme may be illustrated using a FEOL processing scenario, such approaches may also be applicable to BEOL processing. Likewise, although an exemplary processing scheme may be illustrated using a BEOL processing scenario, such approaches may also be applicable to FEOL processing.

In accordance with an embodiment of the present disclosure, contact over active gate (COAG) structures and processes are described. One or more embodiments of the present disclosure are directed to semiconductor structures or devices having one or more gate contact structures (e.g., as gate contact vias) disposed over active portions of gate electrodes of the semiconductor structures or devices. One or more embodiments of the present disclosure are directed to methods of fabricating semiconductor structures or devices having one or more gate contact structures formed over active portions of gate electrodes of the semiconductor structures or devices. Approaches described herein may be used to reduce a standard cell area by enabling gate contact formation over active gate regions. In one or more embodiments, the gate contact structures fabricated to contact the gate electrodes are self-aligned via structures.

To provide context, in technologies where space and layout constraints are somewhat relaxed compared with current generation space and layout constraints, a contact to gate structure may be fabricated by making contact to a portion of the gate electrode disposed over an isolation region. As an example, FIG. 1A illustrates a plan view of a semiconductor device having a gate contact disposed over an inactive portion of a gate electrode.

Figure 1A:
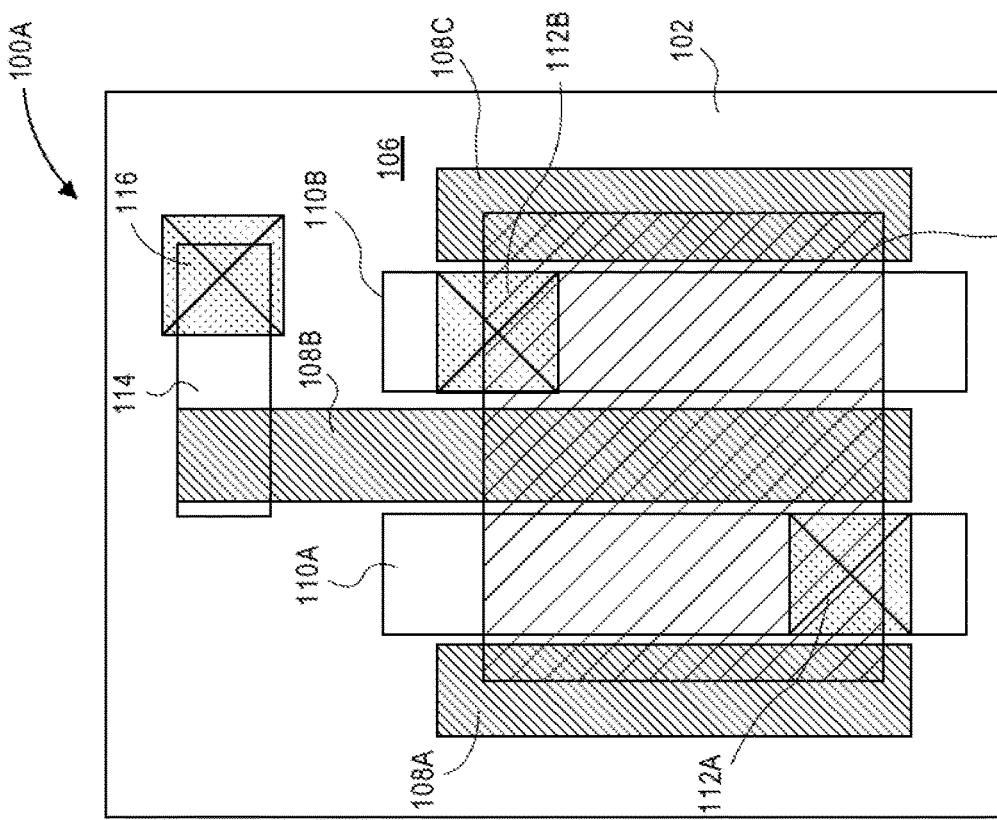
FIG. 1A illustrates a plan view of a semiconductor device having a gate contact disposed over an inactive portion of a gate electrode.

Referring to FIG. 1A, a semiconductor structure or device 100A includes a diffusion or active region 104 disposed in a substrate 102, and within an isolation region 106. One or more gate lines (also known as poly lines), such as gate lines 108A, 108B and 108C are disposed over the diffusion or active region 104 as well as over a portion of the isolation region 106. Source or drain contacts (also known as trench contacts), such as contacts 110A and 110B, are disposed over source and drain regions of the semiconductor structure or device 100A. Trench contact vias 112A and 112B provide contact to trench contacts 110A and 110B, respectively. A separate gate contact 114, and overlying gate contact via 116, provides contact to gate line 108B. In contrast to the source or drain trench contacts 110A or 110B, the gate contact 114 is disposed, from a plan view perspective, over isolation region 106, but not over diffusion or active region 104. Furthermore, neither the gate contact 114 nor gate contact via 116 is disposed between the source or drain trench contacts 110A and 110B.

Figure 1B:
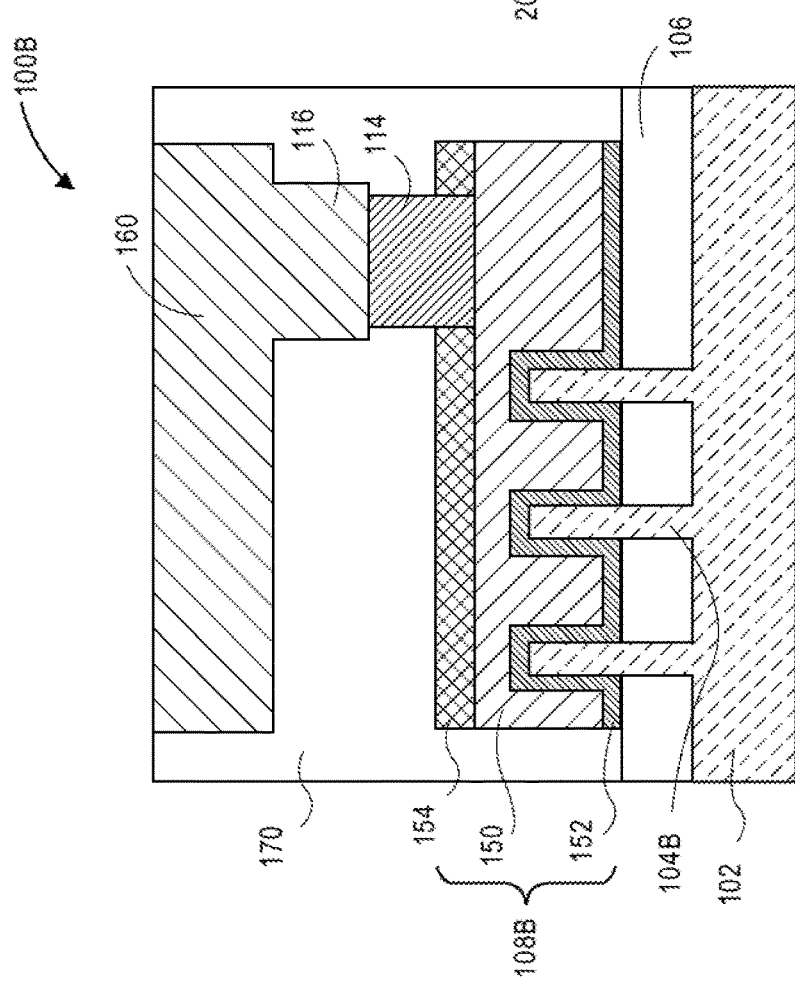
FIG. 1B illustrates a cross-sectional view of a non-planar semiconductor device having a gate contact disposed over an inactive portion of a gate electrode.

FIG. 1B illustrates a cross-sectional view of a non-planar semiconductor device having a gate contact disposed over an inactive portion of a gate electrode. Referring to FIG. 1B, a semiconductor structure or device 100B, e.g. a non-planar version of device 100A of FIG. 1A, includes a non-planar diffusion or active region 104B (e.g., a fin structure) formed from substrate 102, and within isolation region 106. Gate line 108B is disposed over the non-planar diffusion or active region 104B as well as over a portion of the isolation region 106. As shown, gate line 108B includes a gate electrode 150 and gate dielectric layer 152, along with a dielectric cap layer 154. Gate contact 114, and overlying gate contact via 116 are also seen from this perspective, along with an overlying metal interconnect 160, all of which are disposed in inter-layer dielectric stacks or layers 170. Also seen from the perspective of FIG. 1B, the gate contact 114 is disposed over isolation region 106, but not over non-planar diffusion or active region 104B.

Referring again to FIGS. 1A and 1B, the arrangement of semiconductor structure or device 100A and 100B, respectively, places the gate contact over isolation regions. Such an arrangement wastes layout space. However, placing the gate contact over active regions would require either an extremely tight registration budget or gate dimensions would have to increase to provide enough space to land the gate contact. Furthermore, historically, contact to gate over diffusion regions has been avoided for risk of drilling through other gate material (e.g., polysilicon) and contacting the underlying active region. One or more embodiments described herein address the above issues by providing feasible approaches, and the resulting structures, to fabricating contact structures that contact portions of a gate electrode formed over a diffusion or active region.

As an example, FIG. 2A illustrates a plan view of a semiconductor device having a gate contact via disposed over an active portion of a gate electrode, in accordance with an embodiment of the present disclosure. Referring to FIG. 2A, a semiconductor structure or device 200A includes a diffusion or active region 204 disposed in a substrate 202, and within an isolation region 206. One or more gate lines, such as gate lines 208A, 208B and 208C are disposed over the diffusion or active region 204 as well as over a portion of the isolation region 206. Source or drain trench contacts, such as trench contacts 210A and 210B, are disposed over source and drain regions of the semiconductor structure or device 200A. Trench contact vias 212A and 212B provide contact to trench contacts 210A and 210B, respectively. A gate contact via 216, with no intervening separate gate contact layer, provides contact to gate line 208B. In contrast to FIG. 1A, the gate contact 216 is disposed, from a plan view perspective, over the diffusion or active region 204 and between the source or drain contacts 210A and 210B.

Figure 2B:
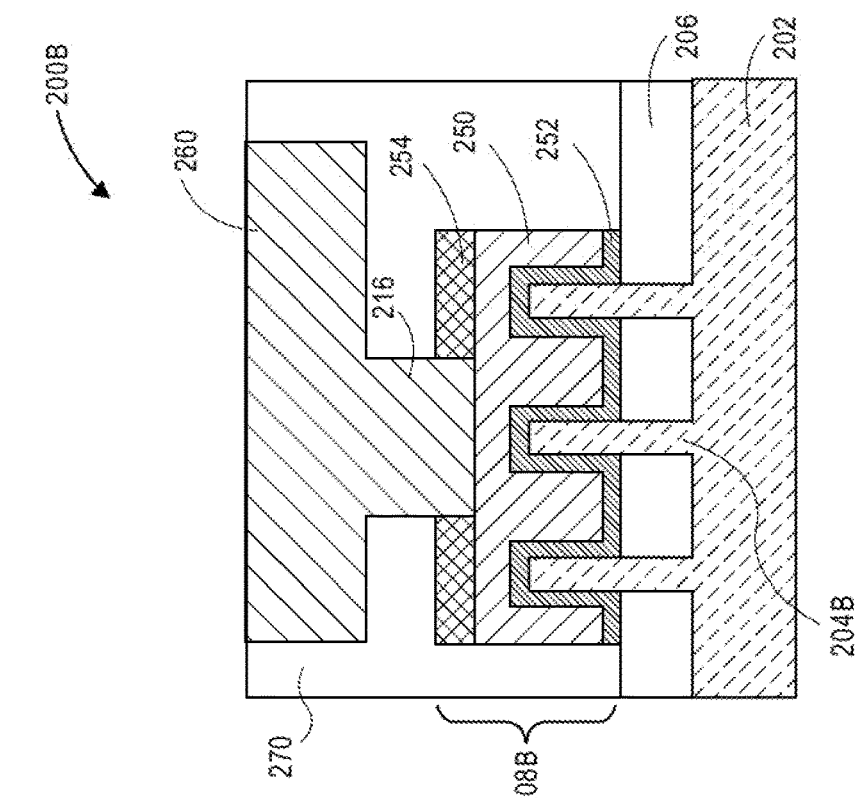
FIG. 2B illustrates a cross-sectional view of a non-planar semiconductor device having a gate contact via disposed over an active portion of a gate electrode, in accordance with an embodiment of the present disclosure.

FIG. 2B illustrates a cross-sectional view of a non-planar semiconductor device having a gate contact via disposed over an active portion of a gate electrode, in accordance with an embodiment of the present disclosure. Referring to FIG. 2B, a semiconductor structure or device 200B, e.g. a non-planar version of device 200A of FIG. 2A, includes a non-planar diffusion or active region 204B (e.g., a fin structure) formed from substrate 202, and within isolation region 206. Gate line 208B is disposed over the non-planar diffusion or active region 204B as well as over a portion of the isolation region 206. As shown, gate line 208B includes a gate electrode 250 and gate dielectric layer 252, along with a dielectric cap layer 254. The gate contact via 216 is also seen from this perspective, along with an overlying metal interconnect 260, both of which are disposed in inter-layer dielectric stacks or layers 270. Also seen from the perspective of FIG. 2B, the gate contact via 216 is disposed over non-planar diffusion or active region 204B.

Thus, referring again to FIGS. 2A and 2B, in an embodiment, trench contact vias 212A, 212B and gate contact via 216 are formed in a same layer and are essentially co-planar. In comparison to FIGS. 1A and 1B, the contact to the gate line would otherwise include and additional gate contact layer, e.g., which could be run perpendicular to the corresponding gate line. In the structure(s) described in association with FIGS. 2A and 2B, however, the fabrication of structures 200A and 200B, respectively, enables the landing of a contact directly from a metal interconnect layer on an active gate portion without shorting to adjacent source drain regions. In an embodiment, such an arrangement provides a large area reduction in circuit layout by eliminating the need to extend transistor gates on isolation to form a reliable contact. As used throughout, in an embodiment, reference to an active portion of a gate refers to that portion of a gate line or structure disposed over (from a plan view perspective) an active or diffusion region of an underlying substrate. In an embodiment, reference to an inactive portion of a gate refers to that portion of a gate line or structure disposed over (from a plan view perspective) an isolation region of an underlying substrate.

In an embodiment, the semiconductor structure or device 200 is a non-planar device such as, but not limited to, a fin-FET or a tri-gate device. In such an embodiment, a corresponding semiconducting channel region is composed of or is formed in a three-dimensional body. In one such embodiment, the gate electrode stacks of gate lines 208A and 208B surround at least a top surface and a pair of sidewalls of the three-dimensional body. In another embodiment, at least the channel region is made to be a discrete three-dimensional body, such as in a gate-all-around device. In one such embodiment, the gate electrode stacks of gate lines 208A and 208B each completely surrounds the channel region.

Generally, one or more embodiments are directed to approaches for, and structures formed from, landing a gate contact via directly on an active transistor gate. Such approaches may eliminate the need for extension of a gate line on isolation for contact purposes. Particular embodiments may involve implementation of a metal cap or shield to eliminate via to metal shorting, such as gate contact (GCN) to trench contact (TCN) shorting during formation of a gate contact in an opening in a gate insulating layer (GILA) cap.

In accordance with one or more embodiments of the present disclosure, selective growth of MOx (e.g., HfOx) is implemented to prevent shorting of via to "wrong" metal during via etch. Embodiments may be implemented to improve edge placement error margins of a via. In a particular embodiment, a gate via is protected from shorting to a source/drain via or trench contact structure. Fabrication of an MOx (M=metal) metal oxide cap structure on source or drain metal contact surfaces prior to gate contact fabrication can be implemented to provide for relaxed edge placement errors for a gate via. The selectively grown metal oxide hard mask can serve both as an etch stop as well as an insulating layer preventing shorting to wrong (incorrect) metal structures during a contact fabrication process.

Advantages of implementing embodiments described herein may include (1) enabling improvement in edge placement margin for gate vias (e.g., CD/overlay variation) without using a separate etch stop for source/drain trench contact structures (e.g., without using a trench insulating layer, TILA, which can require costly metal recess, deposition, and polish operations), and/or (2) enabling larger gate via CD for lower resistance using a same overlay/litho CD uniformity requirement.

In an exemplary processing scheme, FIGS. 3A-3I illustrate cross-sectional views illustrating various operations in a method of fabricating a contact over active gate (COAG) structure with metal oxide cap structures, in accordance with an embodiment of the present disclosure.

Figure 3A:
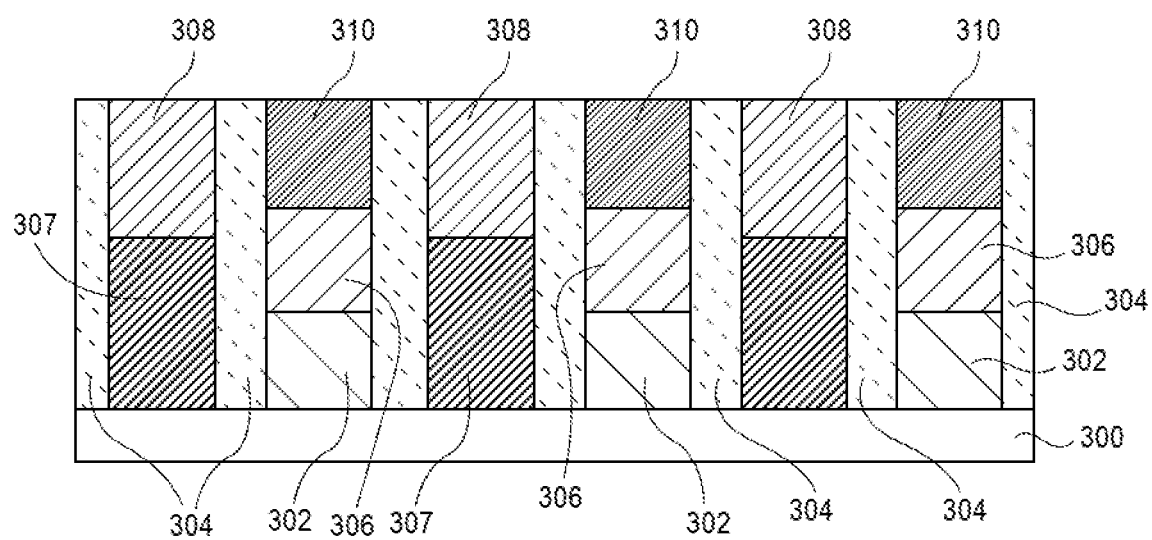
FIGS. 3A-3I illustrate cross-sectional views illustrating various operations in a method of fabricating a contact over active gate (COAG) structure with metal oxide cap structures, in accordance with an embodiment of the present disclosure.

Referring to FIG. 3A, a starting structure includes a plurality of gate structures 302 (e.g., structures including a gate dielectric and gate electrode) over a substrate 300 (such as a silicon substrate or silicon fin protruding from a silicon substrate). A conductive gate fill 306 may optionally be included on or as part of gate structure 302. Dielectric sidewall spacers 304 are along sides of the gate structures 302. An insulating gate cap layer 310 (also referred to as a gate insulating layer, GILA) is on each gate structure 302 and between the dielectric sidewall spacers 304 associated with each gate structure 302. Source or drain structures 307, such as epitaxial source or drain structures, are between the dielectric sidewall spacers 304 of adjacent gate structures 302. Conductive trench contact structures 308 are on the source or drain structures 307 and between the dielectric sidewall spacers 304 of adjacent gate structures 302.

Figure 3B:
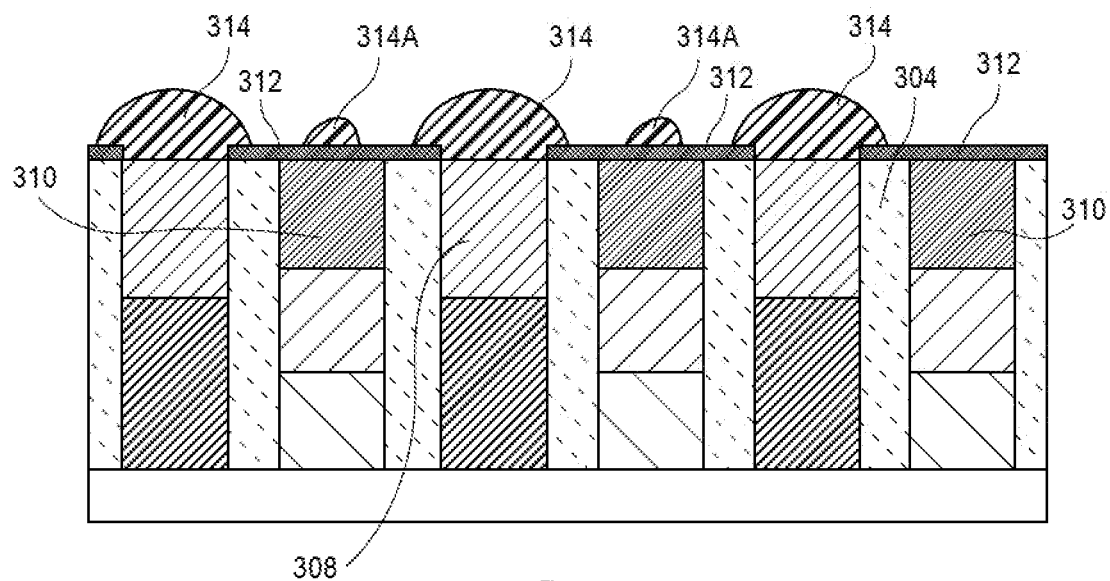

Referring to FIG. 3B, a growth blocking layer 312, such as a self-assembled monolayer (SAM), is formed on the insulating gate cap layer 310 and the dielectric spacers 304 (i.e., on the dielectric surfaces) but not on the conductive trench contact structures 308. In one embodiment, the growth blocking layer 312 is or includes a material selected from the group consisting of $SiO_2$, Al-doped $SiO_2$, SiN, SiC, SiCN and SiCON.

Figure 3C:
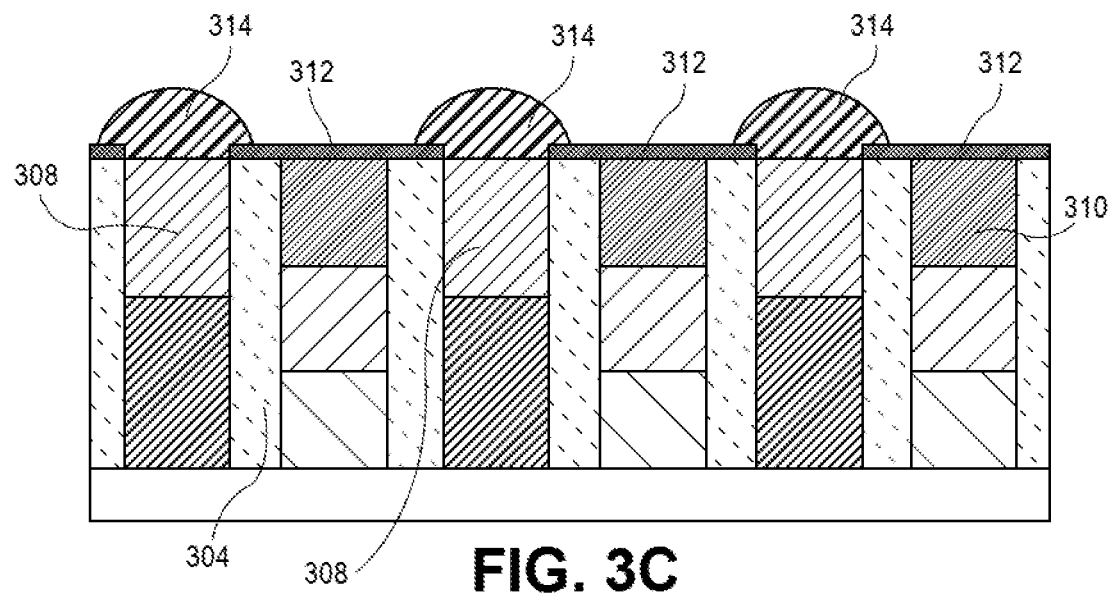

Referring again to FIG. 3B, a metal oxide layer is selectively grown on the conductive trench contact structures 308, but not on the growth blocking layer 312, to form metal oxide cap structures 314. In one embodiment, the metal oxide cap structures 314 are or include hafnium oxide, zirconium oxide, titanium oxide, aluminum oxide, or the like. In one embodiment, each of the metal oxide cap structures 314 has overhang or "mushroom" portions where lateral overgrowth occurs. It is to be appreciated that the selective deposition process may not be "perfect", and that some regions 314A of the metal oxide material may be formed on the growth blocking layer 312, as is depicted. The regions 314A of the metal oxide material formed on the growth blocking layer 312 are then removed by mechanical defect removal, as is depicted in FIG. 3C, and as is described in greater detail below in association with FIG. 5.

Figure 3D:
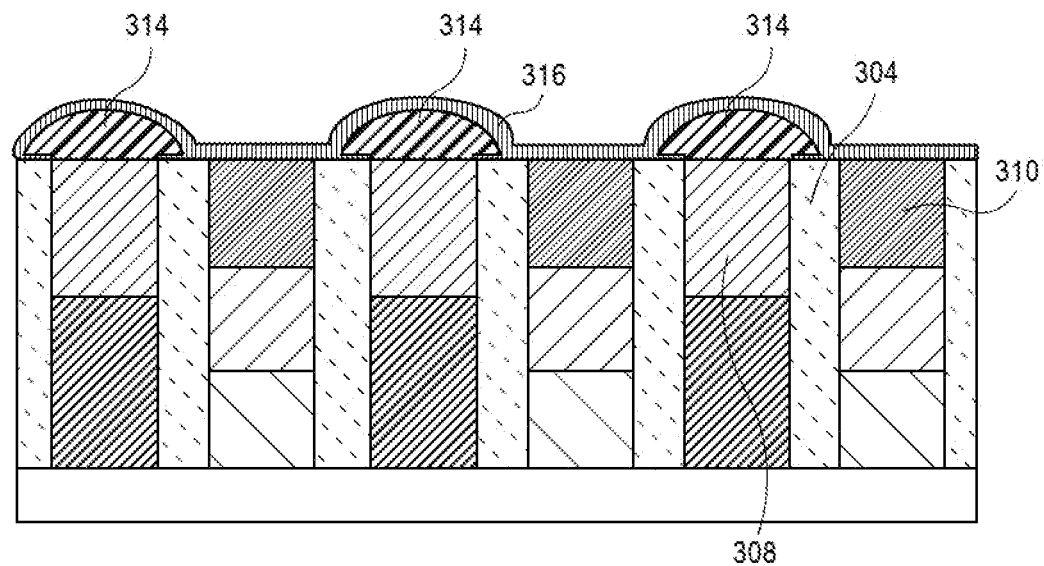
Figure 3E:
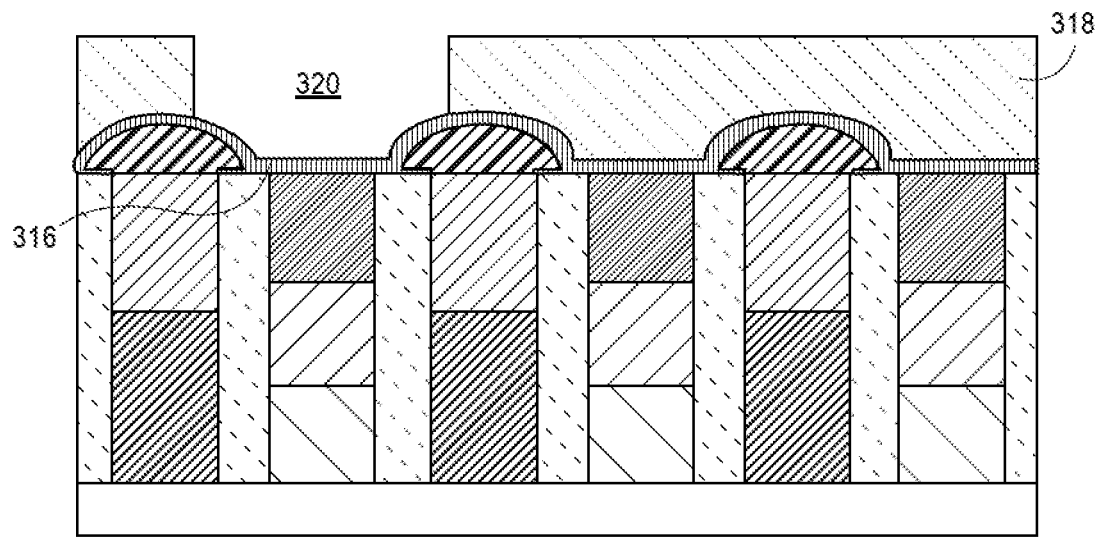

Referring to FIG. 3D, the growth blocking layer 312 is removed, e.g., by an ashing process. A hardmask layer 316 may then be formed conformally over the resulting structures, as is depicted in FIG. 3D. An inter-layer dielectric (ILD) layer 318 is then formed over the structure of FIG. 3D. An openings 320 is then formed in the ILD layer 318, as is depicted in FIG. 3E. The opening 320 is in a location where a conductive gate contact or via is to make contact to an underlying gate structure 302.

Figure 3F:
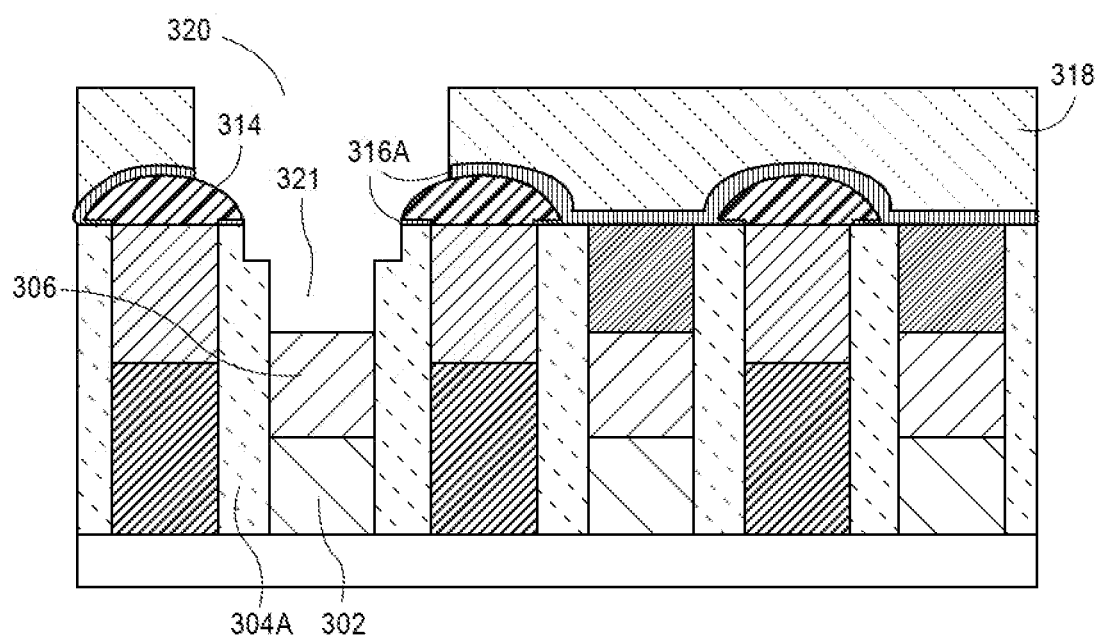

Referring to FIG. 3F, an opening 321 is formed through opening 320. The etching to form opening 321 removes a portion of the hardmask layer (forming patterned hardmask layer 316A), and may also recess a portion of the spacers 304 (forming partially recessed spacers 304A). The etching to form opening 321 also removes a portion of the insulating gate cap layer 310 exposed by the opening 320. Removal of the portion of the insulating gate cap layer 310 exposed by the opening 320 exposes a portion of the underlying corresponding gate structure 302 (which may include conductive gate fill 306).

As shown, in the case of a less constrained lithographic process, although centered, the openings 320/321 also indirectly expose a portion of one or more adjacent conductive trench contact structures 308. It is to be appreciated that a conductive gate contact ultimately formed in openings 320/321 would otherwise form a gate to trench contact short under such circumstances. However, as depicted, the metal oxide cap structures 314 inhibit direct exposure of the one or more adjacent conductive trench contact structures 308 by openings 320/321.

Figure 3G:
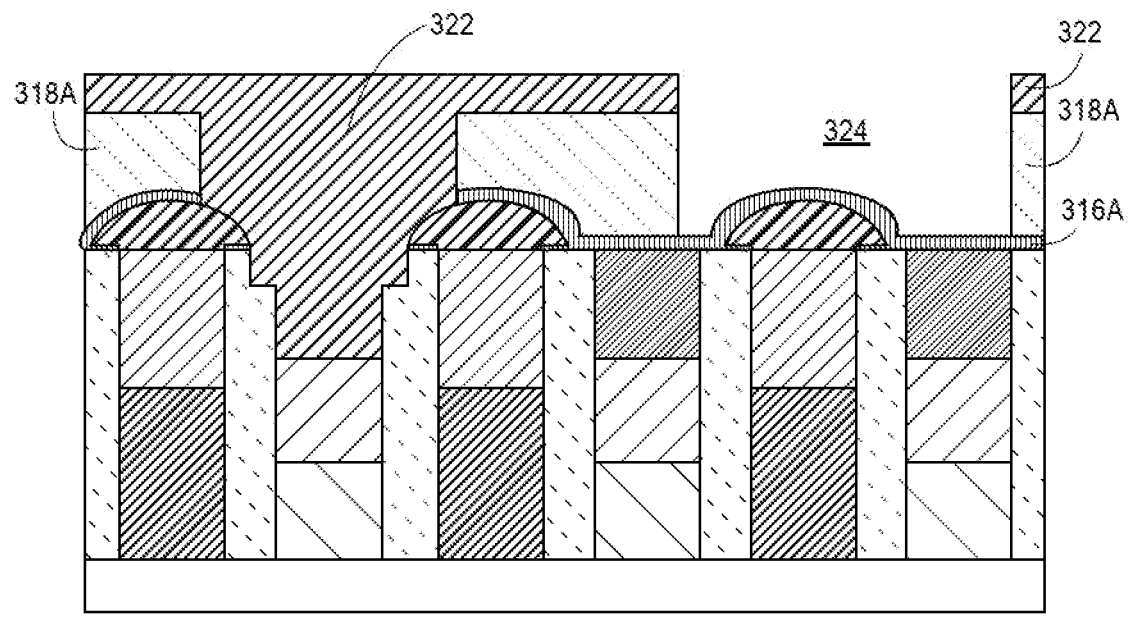
Figure 3H:
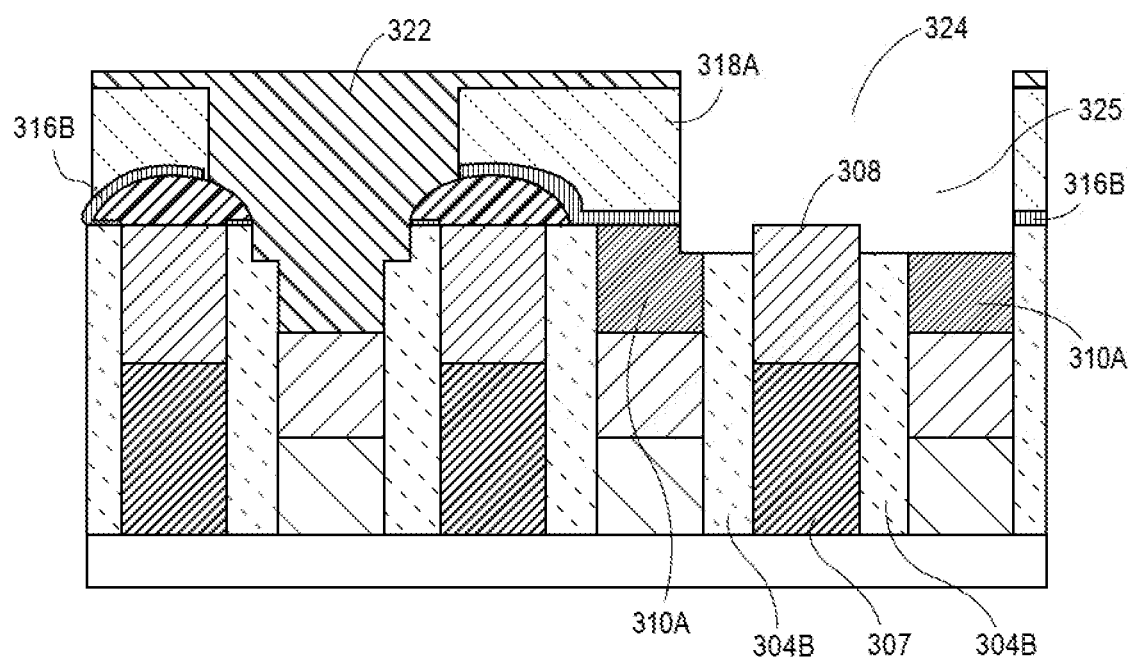

As an optional embodiment at this stage, openings for source or drain contact via formation may be formed. Referring to FIG. 3G, a sacrificial hardmask layer 322, such as a carbon based hardmask layer, is formed over the structure of FIG. 3F. An opening 324 is formed in the sacrificial hardmask layer 322 and in the ILD layer 318 to form twice-patterned ILD layer 318A. The portions of the patterned hardmask layer 316A and the metal oxide cap structure 314 exposed by the opening 324 are then etched to form an opening 325 through now twice-patterned hardmask layer 316B and exposing a conductive trench contact structure 308, as is depicted in FIG. 3H. Exposed portions of adjacent insulating gate cap layers 310 may also be partially etched to form recessed insulating gate cap layers 310A, and may also recess a portion of the spacers 304 forming recessed spacers 304B, as is depicted.

Figure 3I:
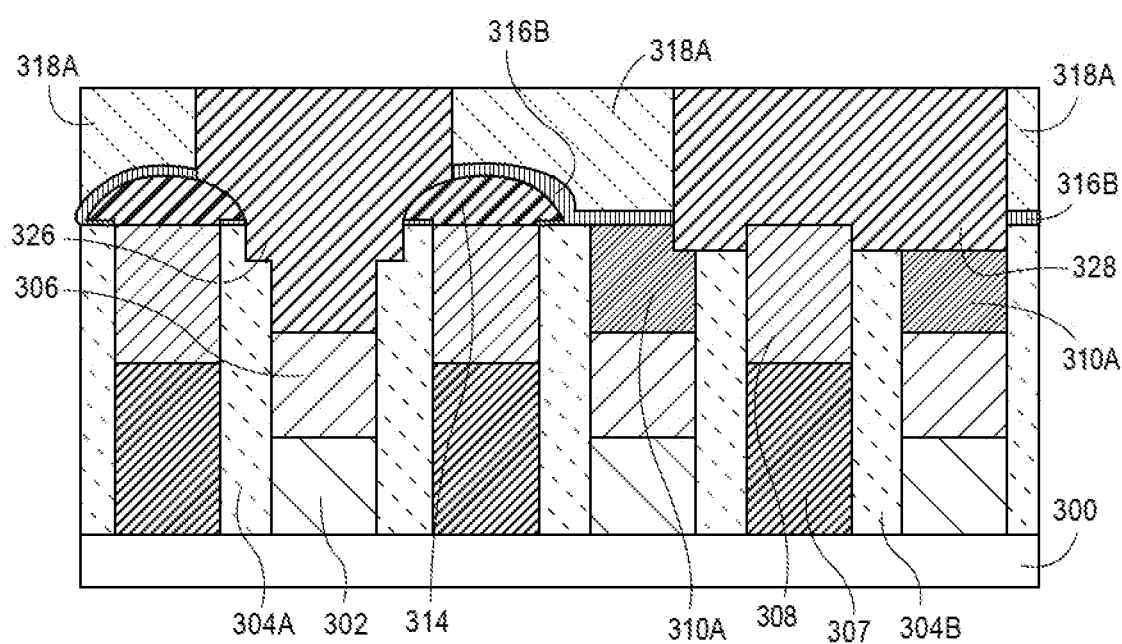

Referring to FIG. 3I, a conductive gate contact or via 326 is formed in the openings 320/321 to make contact to the exposed portion of the underlying corresponding gate structure 302. In one embodiment, a conductive trench contact via 328 is also formed in the openings 324/325 to make contact to the exposed portion of the underlying corresponding conductive trench contact structure 308. The conductive gate contact or via 326 and the conductive trench contact via 328 can be fabricated using a metal fill and planarization process. In an embodiment, as is depicted, the metal oxide cap structures 314 inhibit unwanted electrical contact between the conductive gate contact or via 326 and the immediately adjacent trench contact structures 308.

With reference again to FIG. 3I, in accordance with an embodiment of the present disclosure, an integrated circuit structure includes a plurality of gate structures 302 (and, possibly, 306) above substrate 300. Each of the gate structures 302 (and, possibly, 306) includes a gate insulating layer 310 thereon. A plurality of conductive trench contact structures 308 is alternating with the plurality of gate structures 302. Each of the conductive trench contact structures 308 includes a metal oxide cap structure 314 thereon. An inter-layer dielectric material 318A is over the plurality of gate structures 302 and over the plurality of conductive trench contact structures 308. An opening 320/321 is in the inter-layer dielectric material 318A and in a gate insulating layer 310 of a corresponding one of the plurality of gate structures 302. A conductive via 326 is in the opening 320/321. The conductive via 326 is in direct contact with the corresponding one of the plurality of gate structures 302 (and, possibly, 306), and the conductive via 326 is on a portion of one or more of the metal oxide cap structures 314.

In an embodiment, the integrated circuit structure further includes a plurality of dielectric spacers 304 alternating with the plurality of gate structures 302 (and, possibly, 306) and the plurality of conductive trench contact structures 308. In one such embodiment, each of the metal oxide cap structures 314 overhangs a portion of a corresponding one of the plurality of dielectric spacers 304, as is depicted. In an embodiment, the metal oxide cap structures 314 include a metal oxide layer selected from the group consisting of AlOx, HfOx, ZrOx, TiOx, $Y_2O_3$, $Al_2O_3$-doped SiOx, HfN, and AlN. In an embodiment, the plurality of conductive trench contact structures 308 and the plurality of gate structures 302 (and, possibly, 306) are on a semiconductor fin.

In another aspect, the structures or architectures of the metal oxide cap structures 314 can be tuned to improve adhesion and hermeticity of the metal oxide cap structures 314. To provide context, the metal oxide cap structures 314 of FIGS. 3A-3I are deposited on a flat metal/dielectric grating. Defect removal processes described below may be associated with some line peeling or related issues for such cases. In an embodiment, in order to address line peeling, the metal line and/or the liner of a conductive trench contact structures 308 are recessed to provide an anchoring structure to fix cap adhesion and robustness. Furthermore, such a recess can aid in improving the cap hermeticity, and reducing shorting risks.

To provide further context, chemical etch processes can remove defects but can also remove a portion of the metal oxide cap structures 314 and jeopardize the integrity and hermeticity of the metal oxide cap structures 314. Due to the similar chemical reactivity of the metal oxide cap structures 314 and the spacer 304 (e.g., SiN) surfaces, it may be difficult to redo the passivation operation and maintain selectivity. In an embodiment, chemical (wet/dry) processes are implemented to selectively recess metal lines and/or liners. The recess process is not only selective to other components in the stack but also extremely well controlled to just a few nanometers, and is uniform.

Figure 4A:
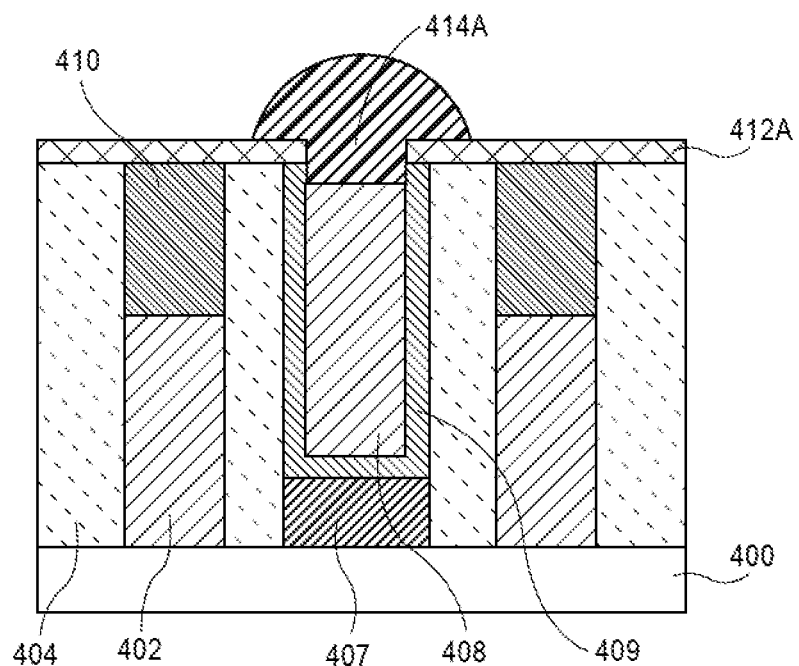
FIG. 4A illustrates a cross-sectional view illustrating a metal oxide cap structure, in accordance with an embodiment of the present disclosure.

In a first example of an anchored metal oxide cap structure, FIG. 4A illustrates a cross-sectional view illustrating a metal oxide cap structure, in accordance with an embodiment of the present disclosure.

Referring to FIG. 4A, an integrated circuit structure includes a plurality of gate structures 402 above substrate 400. Each of the gate structures 402 includes a gate insulating layer 410 thereon. Dielectric sidewall spacers 404 are along sides of the gate structures 402. A source or drain structure 407, such as an epitaxial source or drain structure, is between the dielectric sidewall spacers 404 of adjacent gate structures 402. A conductive trench contact structure 408 is on the source or drain structure 407 and between the dielectric sidewall spacers 404 of adjacent gate structures 402. A growth blocking layer 412A, such as a self-assembled monolayer (SAM), is formed on the insulating gate cap layer 410 and the dielectric spacers 404 (i.e., on the dielectric surfaces) but not on the conductive trench contact structure 408. The conductive trench contact structure 408 includes a metal oxide cap structure 414A thereon. In an embodiment, the conductive trench contact structure 408 includes a liner material 409 and a fill material (shown as 408, in this case). In one such embodiment, the fill material 408 is recessed below the liner material 409. The corresponding metal oxide cap structure 414A is on the fill material 408, and the corresponding metal oxide cap structure 414A is over the liner material 409 but not directly on the liner material 409, as is depicted.

Figure 4B:
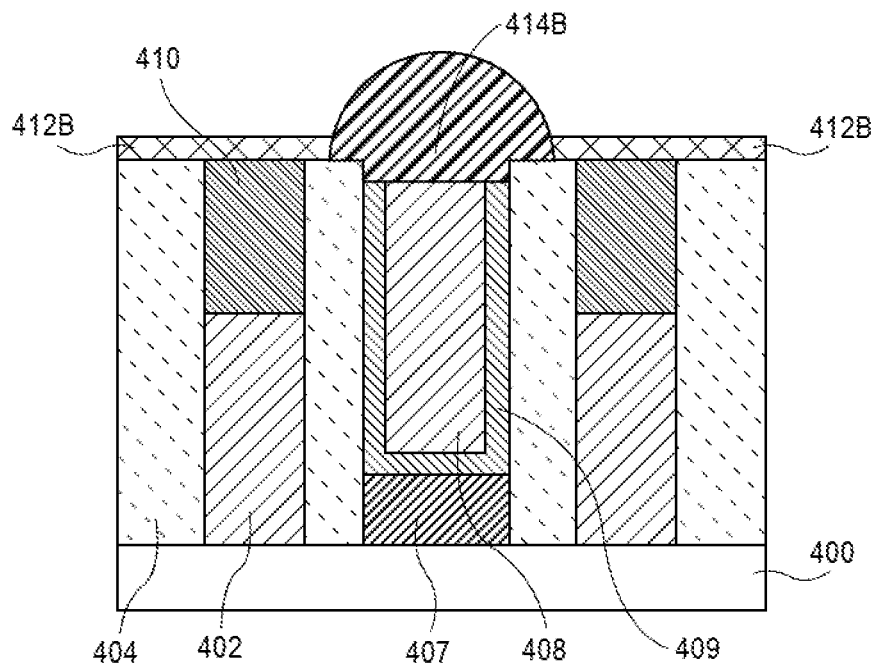
FIG. 4B illustrates a cross-sectional view illustrating another metal oxide cap structure, in accordance with an embodiment of the present disclosure.

In a second example of an anchored metal oxide cap structure, FIG. 4B illustrates a cross-sectional view illustrating another metal oxide cap structure, in accordance with an embodiment of the present disclosure.

Referring to FIG. 4B, an integrated circuit structure includes a plurality of gate structures 402 above substrate 400. Each of the gate structures 402 includes a gate insulating layer 410 thereon. Dielectric sidewall spacers 404 are along sides of the gate structures 402. A source or drain structure 407, such as an epitaxial source or drain structure, is between the dielectric sidewall spacers 404 of adjacent gate structures 402. A conductive trench contact structure 408 is on the source or drain structure 407 and between the dielectric sidewall spacers 404 of adjacent gate structures 402. A growth blocking layer 412B, such as a self-assembled monolayer (SAM), is formed on the insulating gate cap layer 410 and the dielectric spacers 404 (i.e., on the dielectric surfaces) but not on the conductive trench contact structure 408. The conductive trench contact structure 408 includes a metal oxide cap structure 414B thereon. In an embodiment, the conductive trench contact structure 408 includes a liner material 409 and a fill material (shown as 408, in this case). In one such embodiment, the fill material 408 and the liner material 409 are recessed below the plurality of dielectric spacers 404. The corresponding metal oxide cap structure 414B is on the fill material 408 and on the liner material 409, as is depicted.

Figure 4C:
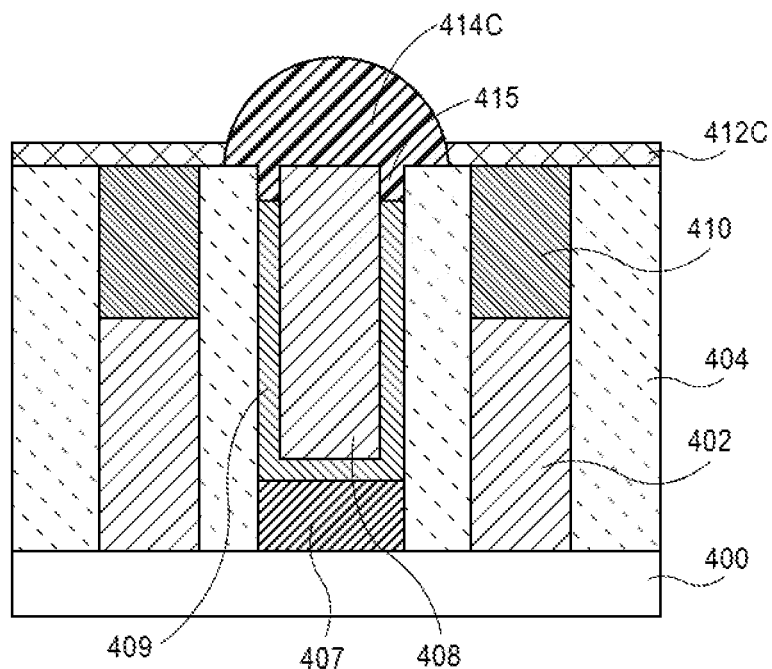
FIG. 4C illustrates a cross-sectional view illustrating yet another metal oxide cap structure, in accordance with an embodiment of the present disclosure.

In a third example of an anchored metal oxide cap structure, FIG. 4C illustrates a cross-sectional view illustrating yet another metal oxide cap structure, in accordance with an embodiment of the present disclosure.

Referring to FIG. 4C, an integrated circuit structure includes a plurality of gate structures 402 above substrate 400. Each of the gate structures 402 includes a gate insulating layer 410 thereon. Dielectric sidewall spacers 404 are along sides of the gate structures 402. A source or drain structure 407, such as an epitaxial source or drain structure, is between the dielectric sidewall spacers 404 of adjacent gate structures 402. A conductive trench contact structure 408 is on the source or drain structure 407 and between the dielectric sidewall spacers 404 of adjacent gate structures 402. A growth blocking layer 412C, such as a self-assembled monolayer (SAM), is formed on the insulating gate cap layer 410 and the dielectric spacers 404 (i.e., on the dielectric surfaces) but not on the conductive trench contact structure 408. The conductive trench contact structure 408 includes a metal oxide cap structure 414C thereon. In an embodiment, the conductive trench contact structure 408 includes a liner material 409 and a fill material (shown as 408, in this case). In one such embodiment, the liner material 409 is recessed below the fill material 408. The corresponding metal oxide cap structure 414C is on the fill material 408 and on the liner material 409, and has extensions 415, as is depicted.

With reference to FIGS. 4A-4C, in an embodiment, a selectively deposited metal oxide cap 414A-414C is anchored deep below a plane of a gate insulating cap and dielectric spacers. The deposited metal oxide cap 414A-414C is, in one embodiment, robust to withstand mechanical and chemical cleans intended to remove only unwanted MOx growth in between the lines of the conductive trench contact structure 408.

It is to be appreciated that, in chemical mechanical planarization (CMP), two parallel sliding surfaces are in contact under a light load. The process tends to preferentially remove surface fragments with a low surface area to volume ratio. Since additional force is required to remove remaining surface with high surface-to-volume ratio (for example, a nano-structured surface), larger particles (or defects) can be preferentially stripped off from the surface.

The strength of the covalent or Van der Waals force between the interaction of the defect particle and the surface is also a predictor of how easily a defect can be removed. For example, less interaction generally translates to a more easily removed defect. In an embodiment, the interaction between a metal oxide cap and underlying material is strong, and the interaction between the defect and a SAM surface is weak. In one such embodiment, CMP is used to remove defects selectively by exploiting the low surface area to volume ratio of the defects, and by exploiting the weak interaction between the selective deposition defects and the SAM-covered surface.

Figure 5:
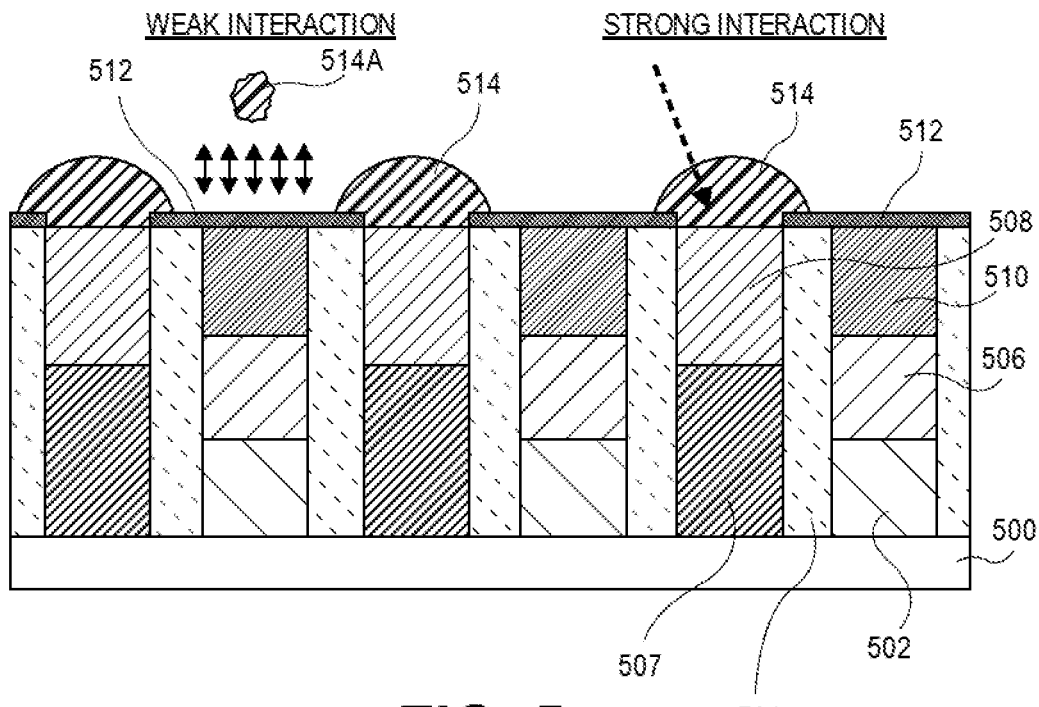
FIG. 5 illustrates a cross-sectional view illustrating weak versus strong cap material interactions in a method of fabricating a contact over active gate (COAG) structure with metal oxide cap structures, in accordance with an embodiment of the present disclosure.

As an example of the above concepts, FIG. 5 illustrates a cross-sectional view illustrating weak versus strong cap material interactions in a method of fabricating a contact over active gate (COAG) structure with metal oxide cap structures, in accordance with an embodiment of the present disclosure.

Referring to FIG. 5, an integrated circuit structure includes a plurality of gate structures 502 (which may include a conductive fill 506) above substrate 500. Each of the gate structures 502 (and, possibly 506) includes a gate insulating layer 510 thereon. Dielectric sidewall spacers 504 are along sides of the gate structures 502. Source or drain structures 507, such as epitaxial source or drain structures, are between the dielectric sidewall spacers 504 of adjacent gate structures 502. A plurality of conductive trench contact structures 508 is on the source or drain structures 507 and between the dielectric sidewall spacers 504 of adjacent gate structures 502. A growth blocking layer 512, such as a self-assembled monolayer (SAM), is formed on the insulating gate cap layer 510 and the dielectric spacers 504 (i.e., on the dielectric surfaces) but not on the conductive trench contact structures 508. Each conductive trench contact structure 508 includes a metal oxide cap structure 514 thereon. In an embodiment, the metal oxide cap structure 514 is held with a strong interaction to the corresponding conductive trench contact structure 508. Residual (unwanted) material 514A of the material of the metal oxide cap structures 514 may end up on regions of the growth blocking layer 512. However, such residual (unwanted) material 514A of the material of the metal oxide cap structures 514 are held only with a weal interaction to the growth blocking layer 512. In one such embodiment, the residual (unwanted) material 514A of the material of the metal oxide cap structures 514 are removed from the growth blocking layer 512 using CMP without removing the metal oxide cap structures 514.

In another aspect, approaches for creating an alternate hardmask cap by infiltrating a polymeric cap with a metal oxide material is described. In an embodiment, selective grafting of polymers, or selectively growing polymers (polymerizing) from one surface (i.e., metal) but not the other (i.e., ILD) is described. Polymers can be used as place holder materials, or be made more of a hardmask using infiltration techniques. Embodiments described may rely on selective grafting of a polymer brush and can eliminate the defects cause by other selective processes.

Figure 6A:
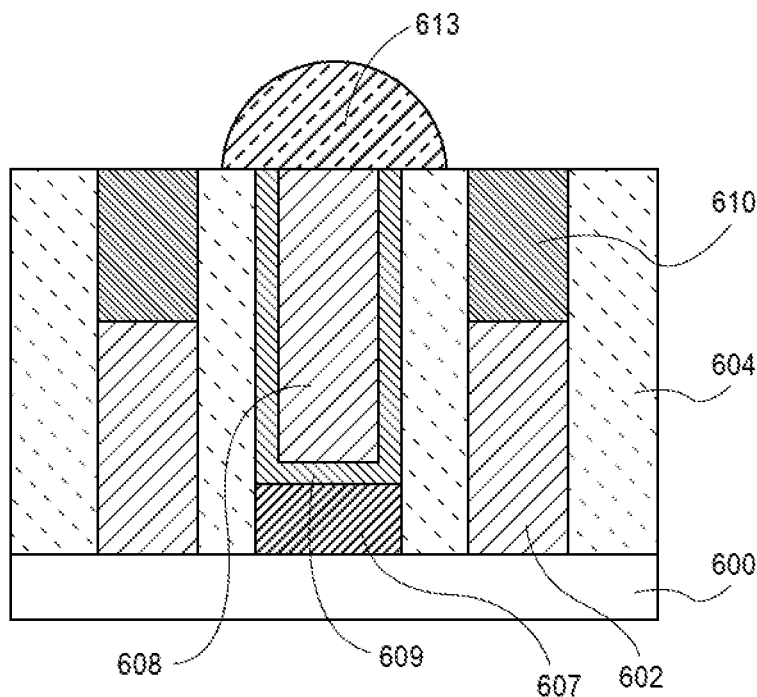
FIGS. 6A-6B illustrate cross-sectional views illustrating various operations in a method of fabricating a metal oxide cap structure, in accordance with an embodiment of the present disclosure.
Figure 6B:
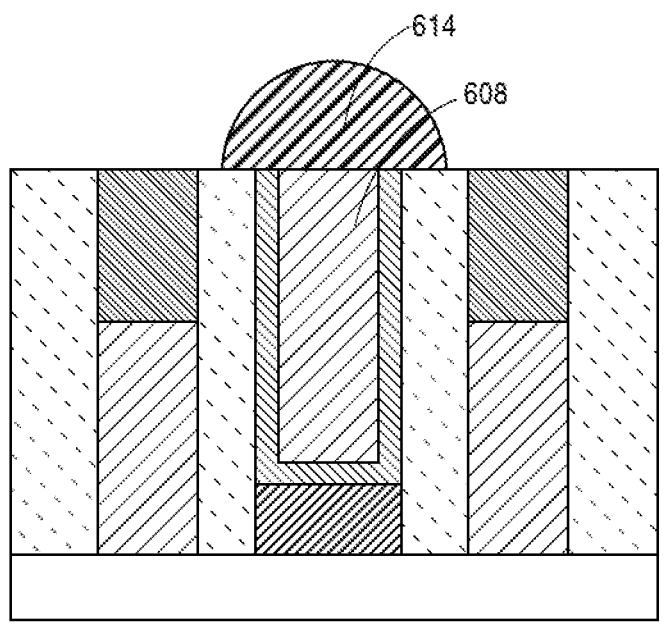

In a first infiltration option, FIGS. 6A-6B illustrate cross-sectional views illustrating various operations in a method of fabricating a metal oxide cap structure, in accordance with an embodiment of the present disclosure.

Referring to FIG. 6A, a starting structure includes a plurality of gate structures 602 above substrate 600. Each of the gate structures 602 includes a gate insulating layer 610 thereon. Dielectric sidewall spacers 604 are along sides of the gate structures 602. A source or drain structure 607, such as an epitaxial source or drain structure, is between the dielectric sidewall spacers 604 of adjacent gate structures 602. A conductive trench contact structure 608 is on the source or drain structure 607 and between the dielectric sidewall spacers 604 of adjacent gate structures 602. In an embodiment, the conductive trench contact structure 608 includes a liner material 609 and a fill material (shown as 608, in this case). The conductive trench contact structure 608 includes a polymer cap structure 613 thereon. In one such embodiment, the polymer cap structure 613 is formed by growth or polymer grafting. In an embodiment, the polymer cap structure 613 includes a polymer selected from the group consisting of poly-4-vinylpyridine, poly-2-vinylpyridine, PMMA, acrylic and methacrylic polymers, and PEO.

Referring to FIG. 6B, a metal oxide material is formed on the structure of FIG. 6A. Portions of the metal oxide material formed on the polymer cap structure 613 may infiltrate the polymer cap structure 613. Portions of the metal oxide material formed elsewhere may be removed selectively from the infiltrated polymer cap structure 613. The polymer of the infiltrated polymer cap structure 613 may then be ashed to leave a metal oxide cap structure 614 to remain on the conductive trench contact structure 608.

In a second infiltration option, FIGS. 7A-7D illustrate cross-sectional views illustrating various operations in another method of fabricating a metal oxide cap structure, in accordance with an embodiment of the present disclosure.

Figure 7A:
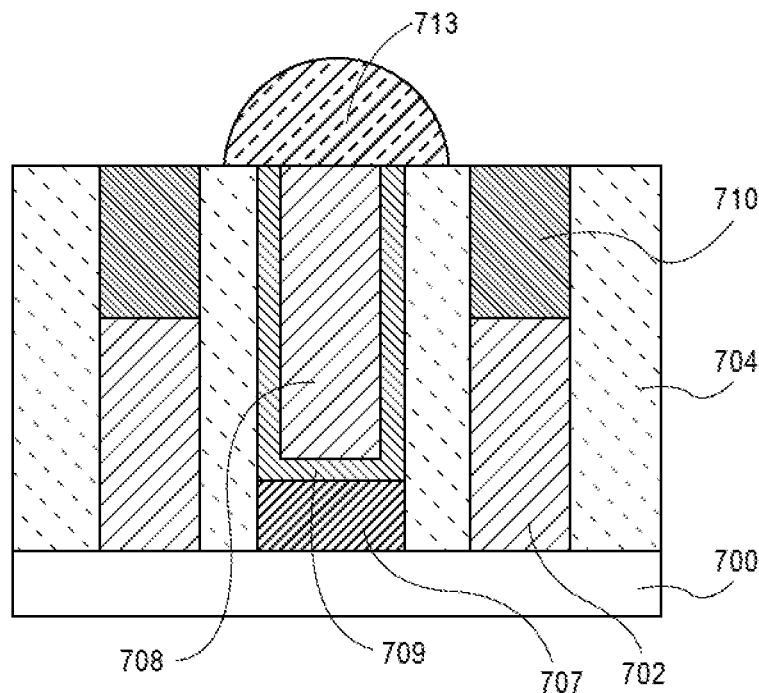
FIGS. 7A-7D illustrate cross-sectional views illustrating various operations in another method of fabricating a metal oxide cap structure, in accordance with an embodiment of the present disclosure.

Referring to FIG. 7A, a starting structure includes a plurality of gate structures 702 above substrate 700. Each of the gate structures 702 includes a gate insulating layer 710 thereon. Dielectric sidewall spacers 704 are along sides of the gate structures 702. A source or drain structure 707, such as an epitaxial source or drain structure, is between the dielectric sidewall spacers 704 of adjacent gate structures 702. A conductive trench contact structure 708 is on the source or drain structure 707 and between the dielectric sidewall spacers 704 of adjacent gate structures 702. In an embodiment, the conductive trench contact structure 708 includes a liner material 709 and a fill material (shown as 708, in this case). The conductive trench contact structure 708 includes a polymer cap structure 713 thereon. In one such embodiment, the polymer cap structure 713 is formed by growth or polymer grafting.

Figure 7B:
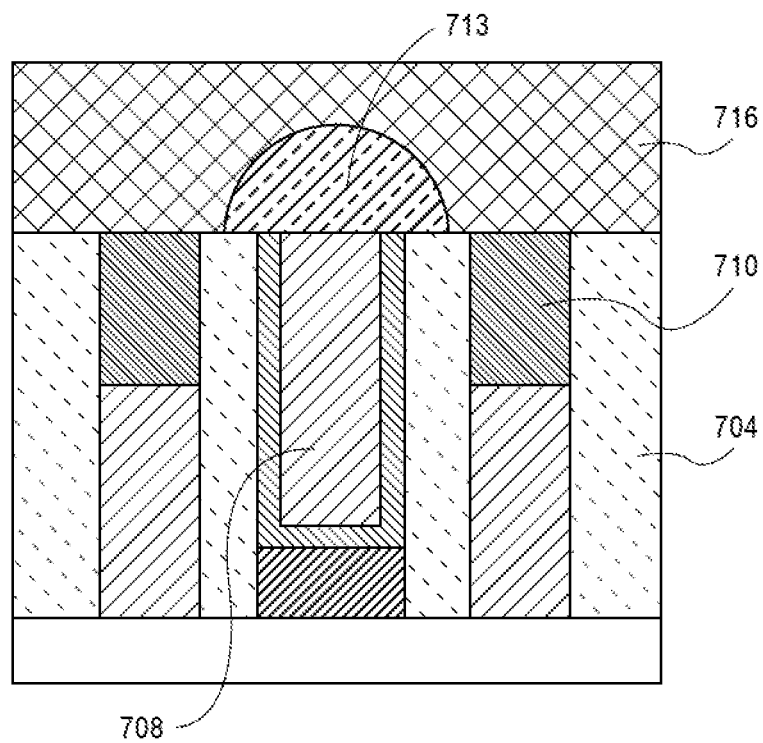
Figure 7C:
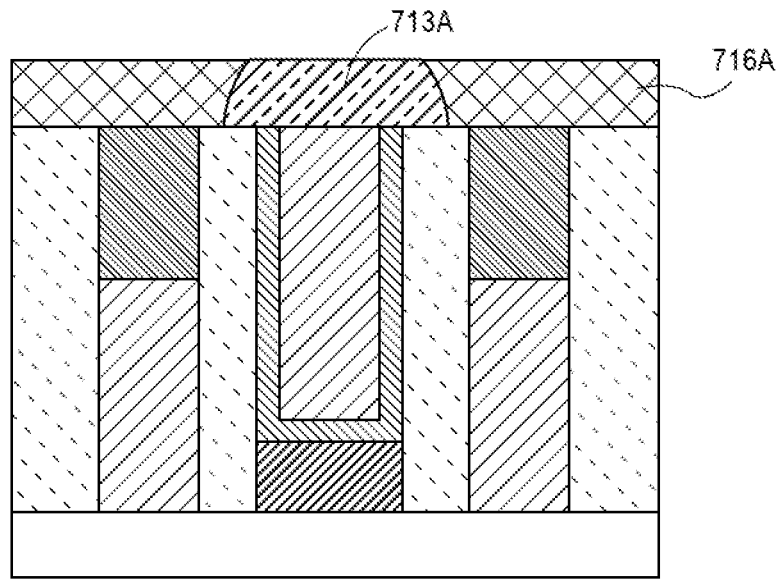

Referring to FIG. 7B, an inter-layer dielectric (ILD) layer 716 is then formed on the structure of FIG. 7A. The ILD layer 716 is then planarized to form planarized ILD layer 716A and to expose a portion of the polymer cap structure 713, as is depicted in FIG. 7C. In one embodiment, the polymer cap structure 713 is also planarized in the process, leaving planarized polymer cap structure 713A, as is depicted.

Figure 7D:
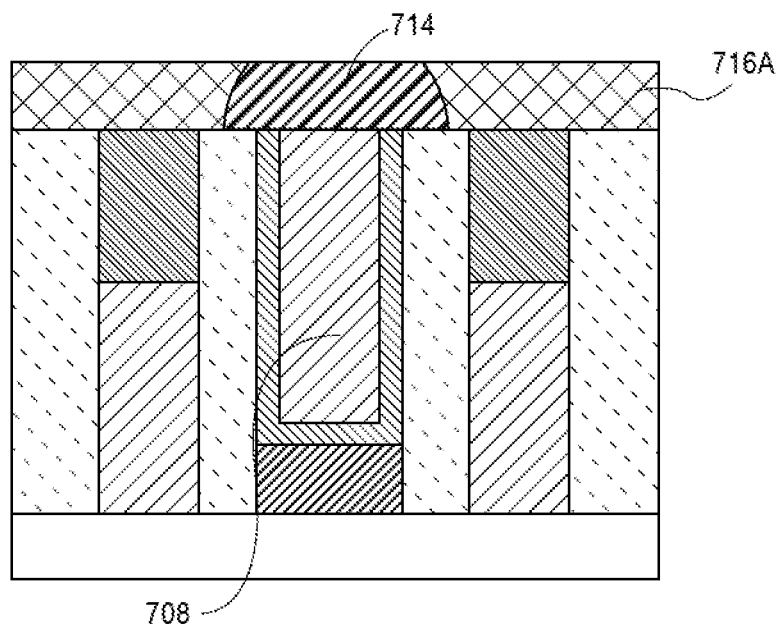

Referring to FIG. 7D, a metal oxide material is formed on the structure of FIG. 7C. Portions of the metal oxide material formed on the planarized polymer cap structure 713A may infiltrate the planarized polymer cap structure 713A. Portions of the metal oxide material formed elsewhere may be removed selectively from the infiltrated planarized polymer cap structure 713A. The polymer of the infiltrated planarized polymer cap structure 713A may then be ashed to leave a metal oxide cap structure 714 to remain on the conductive trench contact structure 708.

In another embodiment, infiltration is achieved using a directed self-assembly approach. For example, a block-copolymer (BCP) is formed followed by selective infiltration of one micro domain over the other.

In an embodiment, with reference to the above three described infiltration options, selective growth of polymers followed by infiltration with MOx (e.g., HfOx, etc.) creates a protective insulating cap on top of the metal, and therefore prevents shorting of via to wrong metal during via etch. Improved edge placement error margin of a conductive via may be achieved. Advantages of implementing embodiments described herein may include one or more of (1) increased yield, (2) allowing scaling with less impact of edge placement errors, and/or (3) much less risk with defects compared to previous solutions using selective deposition. In an embodiment, a polymer deposition and infiltration approach provides for a unique shape and growth profile. Such an approach may also result in some elements and functional chemical groups related to the polymer backbone that can remain in the formed MOx structure.

Figure 8A:
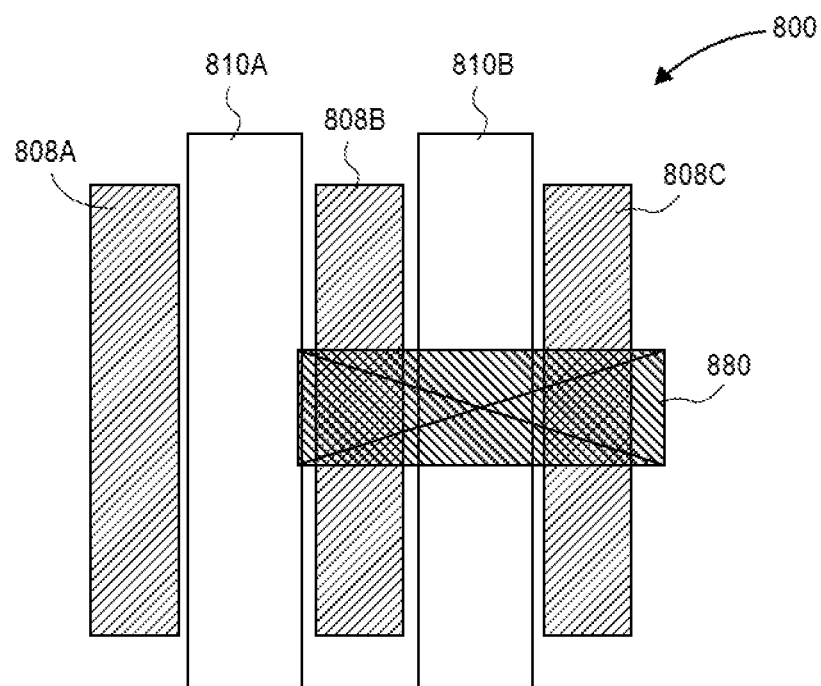
FIG. 8A illustrates a plan view of another semiconductor device having a gate contact via disposed over an active portion of a gate, in accordance with another embodiment of the present disclosure.

The approaches and structures described herein may enable formation of other structures or devices that were not possible or difficult to fabricate using other methodologies. In a first example, FIG. 8A illustrates a plan view of another semiconductor device having a gate contact via disposed over an active portion of a gate, in accordance with another embodiment of the present disclosure. Referring to FIG. 8A, a semiconductor structure or device 800 includes a plurality of gate structures 808A-808C interdigitated with a plurality of trench contacts 810A and 810B (these features are disposed above an active region of a substrate, not shown). A gate contact via 880 is formed on an active portion the gate structure 808B. The gate contact via 880 is further disposed on the active portion of the gate structure 808C, coupling gate structures 808B and 808C. It is to be appreciated that the intervening trench contact 810B may be isolated from the contact via 880 by using an intervening metal oxide cap as described above. The contact configuration of FIG. 8A may provide an easier approach to strapping adjacent gate lines in a layout, without the need to route the strap through upper layers of metallization, hence enabling smaller cell areas or less intricate wiring schemes, or both.

Figure 8B:
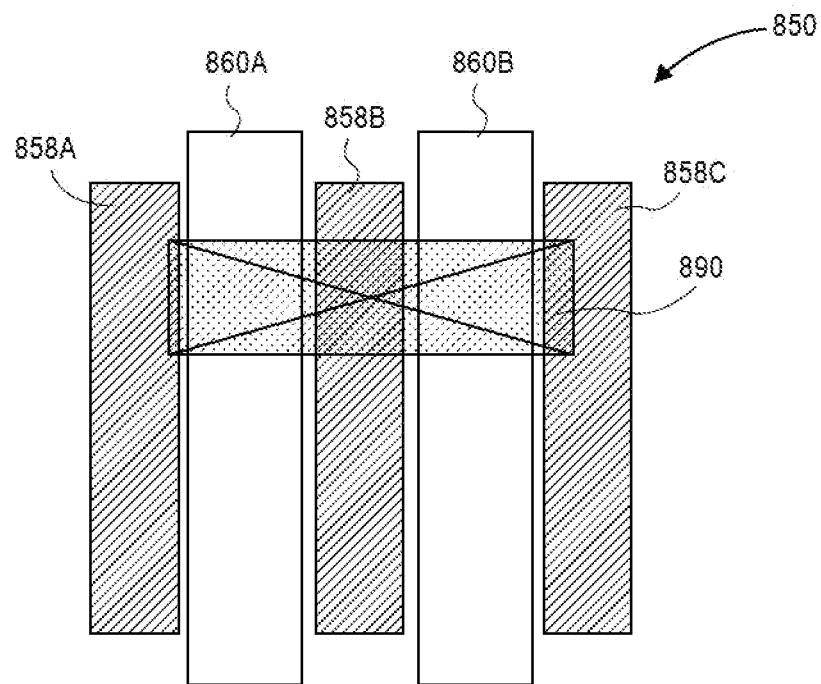
FIG. 8B illustrates a plan view of another semiconductor device having a trench contact via coupling a pair of trench contacts, in accordance with another embodiment of the present disclosure.

In a second example, FIG. 8B illustrates a plan view of another semiconductor device having a trench contact via coupling a pair of trench contacts, in accordance with another embodiment of the present disclosure. Referring to FIG. 8B, a semiconductor structure or device 850 includes a plurality of gate structures 858A-858C interdigitated with a plurality of trench contacts 860A and 860B (these features are disposed above an active region of a substrate, not shown). A trench contact via 890 is formed on the trench contact 860A. The trench contact via 890 is further disposed on the trench contact 860B, coupling trench contacts 860A and 860B. It is to be appreciated that the intervening gate structure 858B may be isolated from the trench contact via 890 by using a gate isolation cap layer (e.g., by a GILA process). The contact configuration of FIG. 8B may provide an easier approach to strapping adjacent trench contacts in a layout, without the need to route the strap through upper layers of metallization, hence enabling smaller cell areas or less intricate wiring schemes, or both.

As described throughout the present application, a substrate may be composed of a semiconductor material that can withstand a manufacturing process and in which charge can migrate. In an embodiment, a substrate is described herein is a bulk substrate composed of a crystalline silicon, silicon/germanium or germanium layer doped with a charge carrier, such as but not limited to phosphorus, arsenic, boron or a combination thereof, to form an active region. In one embodiment, the concentration of silicon atoms in such a bulk substrate is greater than 97%. In another embodiment, a bulk substrate is composed of an epitaxial layer grown atop a distinct crystalline substrate, e.g. a silicon epitaxial layer grown atop a boron-doped bulk silicon mono-crystalline substrate. A bulk substrate may alternatively be composed of a group III-V material. In an embodiment, a bulk substrate is composed of a III-V material such as, but not limited to, gallium nitride, gallium phosphide, gallium arsenide, indium phosphide, indium antimonide, indium gallium arsenide, aluminum gallium arsenide, indium gallium phosphide, or a combination thereof. In one embodiment, a bulk substrate is composed of a III-V material and the charge-carrier dopant impurity atoms are ones such as, but not limited to, carbon, silicon, germanium, oxygen, sulfur, selenium or tellurium.

As described throughout the present application, isolation regions such as shallow trench isolation regions or sub-fin isolation regions may be composed of a material suitable to ultimately electrically isolate, or contribute to the isolation of, portions of a permanent gate structure from an underlying bulk substrate or to isolate active regions formed within an underlying bulk substrate, such as isolating fin active regions. For example, in one embodiment, an isolation region is composed of one or more layers of a dielectric material such as, but not limited to, silicon dioxide, silicon oxy-nitride, silicon nitride, carbon-doped silicon nitride, or a combination thereof.

As described throughout the present application, gate lines or gate structures may be composed of a gate electrode stack which includes a gate dielectric layer and a gate electrode layer. In an embodiment, the gate electrode of the gate electrode stack is composed of a metal gate and the gate dielectric layer is composed of a high-k material. For example, in one embodiment, the gate dielectric layer is composed of a material such as, but not limited to, hafnium oxide, hafnium oxy-nitride, hafnium silicate, lanthanum oxide, zirconium oxide, zirconium silicate, tantalum oxide, barium strontium titanate, barium titanate, strontium titanate, yttrium oxide, aluminum oxide, lead scandium tantalum oxide, lead zinc niobate, or a combination thereof. Furthermore, a portion of gate dielectric layer may include a layer of native oxide formed from the top few layers of a semiconductor substrate. In an embodiment, the gate dielectric layer is composed of a top high-k portion and a lower portion composed of an oxide of a semiconductor material. In one embodiment, the gate dielectric layer is composed of a top portion of hafnium oxide and a bottom portion of silicon dioxide or silicon oxy-nitride. In some implementations, a portion of the gate dielectric is a "U"-shaped structure that includes a bottom portion substantially parallel to the surface of the substrate and two sidewall portions that are substantially perpendicular to the top surface of the substrate.

In one embodiment, a gate electrode is composed of a metal layer such as, but not limited to, metal nitrides, metal carbides, metal silicides, metal aluminides, hafnium, zirconium, titanium, tantalum, aluminum, ruthenium, palladium, platinum, cobalt, nickel or conductive metal oxides. In a specific embodiment, the gate electrode is composed of a non-workfunction-setting fill material formed above a metal workfunction-setting layer. The gate electrode layer may consist of a P-type workfunction metal or an N-type workfunction metal, depending on whether the transistor is to be a PMOS or an NMOS transistor. In some implementations, the gate electrode layer may consist of a stack of two or more metal layers, where one or more metal layers are workfunction metal layers and at least one metal layer is a conductive fill layer. For a PMOS transistor, metals that may be used for the gate electrode include, but are not limited to, ruthenium, palladium, platinum, cobalt, nickel, and conductive metal oxides, e.g., ruthenium oxide. A P-type metal layer will enable the formation of a PMOS gate electrode with a workfunction that is between about 4.9 eV and about 5.2 eV. For an NMOS transistor, metals that may be used for the gate electrode include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An N-type metal layer will enable the formation of an NMOS gate electrode with a workfunction that is between about 3.9 eV and about 4.2 eV. In some implementations, the gate electrode may consist of a "U"-shaped structure that includes a bottom portion substantially parallel to the surface of the substrate and two sidewall portions that are substantially perpendicular to the top surface of the substrate. In another implementation, at least one of the metal layers that form the gate electrode may simply be a planar layer that is substantially parallel to the top surface of the substrate and does not include sidewall portions substantially perpendicular to the top surface of the substrate. In further implementations of the disclosure, the gate electrode may consist of a combination of U-shaped structures and planar, non-U-shaped structures. For example, the gate electrode may consist of one or more U-shaped metal layers formed atop one or more planar, non-U-shaped layers.

As described throughout the present application, spacers associated with gate lines or electrode stacks may be composed of a material suitable to ultimately electrically isolate, or contribute to the isolation of, a permanent gate structure from adjacent conductive contacts, such as self-aligned contacts. For example, in one embodiment, the spacers are composed of a dielectric material such as, but not limited to, silicon dioxide, silicon oxy-nitride, silicon nitride, or carbon-doped silicon nitride.

In an embodiment, as used throughout the present description, interlayer dielectric (ILD) material is composed of or includes a layer of a dielectric or insulating material. Examples of suitable dielectric materials include, but are not limited to, oxides of silicon (e.g., silicon dioxide ($SiO_2$)), doped oxides of silicon, fluorinated oxides of silicon, carbon doped oxides of silicon, various low-k dielectric materials known in the arts, and combinations thereof. The interlayer dielectric material may be formed by techniques, such as, for example, chemical vapor deposition (CVD), physical vapor deposition (PVD), or by other deposition methods.

In an embodiment, as is also used throughout the present description, metal lines or interconnect line material (and via material) is composed of one or more metal or other conductive structures. A common example is the use of copper lines and structures that may or may not include barrier layers between the copper and surrounding ILD material. As used herein, the term metal includes alloys, stacks, and other combinations of multiple metals. For example, the metal interconnect lines may include barrier layers (e.g., layers including one or more of Ta, TaN, Ti or TiN), stacks of different metals or alloys, etc. Thus, the interconnect lines may be a single material layer, or may be formed from several layers, including conductive liner layers and fill layers. Any suitable deposition process, such as electroplating, chemical vapor deposition or physical vapor deposition, may be used to form interconnect lines. In an embodiment, the interconnect lines are composed of a conductive material such as, but not limited to, Cu, Al, Ti, Zr, Hf, V, Ru, Co, Ni, Pd, Pt, W, Ag, Au or alloys thereof. The interconnect lines are also sometimes referred to in the art as traces, wires, lines, metal, or simply interconnect.

In an embodiment, as is also used throughout the present description, hardmask materials are composed of dielectric materials different from the interlayer dielectric material. In one embodiment, different hardmask materials may be used in different regions so as to provide different growth or etch selectivity to each other and to the underlying dielectric and metal layers. In some embodiments, a hardmask layer includes a layer of a nitride of silicon (e.g., silicon nitride) or a layer of an oxide of silicon, or both, or a combination thereof. Other suitable materials may include carbon-based materials. In another embodiment, a hardmask material includes a metal species. For example, a hardmask or other overlying material may include a layer of a nitride of titanium or another metal (e.g., titanium nitride). Potentially lesser amounts of other materials, such as oxygen, may be included in one or more of these layers. Alternatively, other hardmask layers known in the arts may be used depending upon the particular implementation. The hardmask layers maybe formed by CVD, PVD, or by other deposition methods.

In an embodiment, as is also used throughout the present description, lithographic operations are performed using 193 nm immersion lithography (i193), extreme ultra-violet (EUV) lithography or electron beam direct write (EBDW) lithography, or the like. A positive tone or a negative tone resist may be used. In one embodiment, a lithographic mask is a trilayer mask composed of a topographic masking portion, an anti-reflective coating (ARC) layer, and a photoresist layer. In a particular such embodiment, the topographic masking portion is a carbon hardmask (CHM) layer and the anti-reflective coating layer is a silicon ARC layer.

In an embodiment, approaches described herein may involve formation of a contact pattern which is very well aligned to an existing gate pattern while eliminating the use of a lithographic operation with exceedingly tight registration budget. In one such embodiment, this approach enables the use of intrinsically highly selective wet etching (e.g., versus dry or plasma etching) to generate contact openings. In an embodiment, a contact pattern is formed by utilizing an existing gate pattern in combination with a contact plug lithography operation. In one such embodiment, the approach enables elimination of the need for an otherwise critical lithography operation to generate a contact pattern, as used in other approaches. In an embodiment, a trench contact grid is not separately patterned, but is rather formed between poly (gate) lines. For example, in one such embodiment, a trench contact grid is formed subsequent to gate grating patterning but prior to gate grating cuts.

Furthermore, a gate stack structure may be fabricated by a replacement gate process. In such a scheme, dummy gate material such as polysilicon or silicon nitride pillar material, may be removed and replaced with permanent gate electrode material. In one such embodiment, a permanent gate dielectric layer is also formed in this process, as opposed to being carried through from earlier processing. In an embodiment, dummy gates are removed by a dry etch or wet etch process. In one embodiment, dummy gates are composed of polycrystalline silicon or amorphous silicon and are removed with a dry etch process including use of $SF_6$. In another embodiment, dummy gates are composed of polycrystalline silicon or amorphous silicon and are removed with a wet etch process including use of aqueous $NH_4OH$ or tetramethylammonium hydroxide. In one embodiment, dummy gates are composed of silicon nitride and are removed with a wet etch including aqueous phosphoric acid.

In an embodiment, one or more approaches described herein contemplate essentially a dummy and replacement gate process in combination with a dummy and replacement contact process to arrive at structure. In one such embodiment, the replacement contact process is performed after the replacement gate process to allow high temperature anneal of at least a portion of the permanent gate stack. For example, in a specific such embodiment, an anneal of at least a portion of the permanent gate structures, e.g., after a gate dielectric layer is formed, is performed at a temperature greater than approximately 600 degrees Celsius. The anneal is performed prior to formation of the permanent contacts.

In some embodiments, the arrangement of a semiconductor structure or device places a gate contact over portions of a gate line or gate stack over isolation regions. However, such an arrangement may be viewed as inefficient use of layout space. In another embodiment, a semiconductor device has contact structures that contact portions of a gate electrode formed over an active region. In general, prior to (e.g., in addition to) forming a gate contact structure (such as a via) over an active portion of a gate and in a same layer as a trench contact via, one or more embodiments of the present disclosure include first using a gate aligned trench contact process. Such a process may be implemented to form trench contact structures for semiconductor structure fabrication, e.g., for integrated circuit fabrication. In an embodiment, a trench contact pattern is formed as aligned to an existing gate pattern. By contrast, other approaches typically involve an additional lithography process with tight registration of a lithographic contact pattern to an existing gate pattern in combination with selective contact etches. For example, another process may include patterning of a poly (gate) grid with separate patterning of contact features.

It is to be appreciated that pitch division processing and patterning schemes may be implemented to enable embodiments described herein or may be included as part of embodiments described herein. Pitch division patterning typically refers to pitch halving, pitch quartering etc. Pitch division schemes may be applicable to FEOL processing, BEOL processing, or both FEOL (device) and BEOL (metallization) processing. In accordance with one or more embodiments described herein, optical lithography is first implemented to print unidirectional lines (e.g., either strictly unidirectional or predominantly unidirectional) in a predefined pitch. Pitch division processing is then implemented as a technique to increase line density.

In an embodiment, the term "grating structure" for fins, gate lines, metal lines, ILD lines or hardmask lines is used herein to refer to a tight pitch grating structure. In one such embodiment, the tight pitch is not achievable directly through a selected lithography. For example, a pattern based on a selected lithography may first be formed, but the pitch may be halved by the use of spacer mask patterning, as is known in the art. Even further, the original pitch may be quartered by a second round of spacer mask patterning. Accordingly, the grating-like patterns described herein may have metal lines, ILD lines or hardmask lines spaced at a substantially consistent pitch and having a substantially consistent width. For example, in some embodiments the pitch variation would be within ten percent and the width variation would be within ten percent, and in some embodiments, the pitch variation would be within five percent and the width variation would be within five percent. The pattern may be fabricated by a pitch halving or pitch quartering, or other pitch division, approach. In an embodiment, the grating is not necessarily single pitch.

In an embodiment, a blanket film is patterned using lithography and etch processing which may involve, e.g., spacer-based-double-patterning (SBDP) or pitch halving, or spacer-based-quadruple-patterning (SBQP) or pitch quartering. It is to be appreciated that other pitch division approaches may also be implemented. In any case, in an embodiment, a gridded layout may be fabricated by a selected lithography approach, such as 193 nm immersion lithography (193i). Pitch division may be implemented to increase the density of lines in the gridded layout by a factor of n. Gridded layout formation with 193i lithography plus pitch division by a factor of 'n' can be designated as 193i+P/n Pitch Division. In one such embodiment, 193 nm immersion scaling can be extended for many generations with cost effective pitch division.

It is also to be appreciated that not all aspects of the processes described above need be practiced to fall within the spirit and scope of embodiments of the present disclosure. For example, in one embodiment, dummy gates need not ever be formed prior to fabricating gate contacts over active portions of the gate stacks. The gate stacks described above may actually be permanent gate stacks as initially formed. Also, the processes described herein may be used to fabricate one or a plurality of semiconductor devices. The semiconductor devices may be transistors or like devices. For example, in an embodiment, the semiconductor devices are a metal-oxide semiconductor (MOS) transistors for logic or memory, or are bipolar transistors. Also, in an embodiment, the semiconductor devices have a three-dimensional architecture, such as a trigate device, an independently accessed double gate device, or a FIN-FET. One or more embodiments may be particularly useful for fabricating semiconductor devices at a 10 nanometer (10 nm) technology node sub-10 nanometer (10 nm) technology node.

Additional or intermediate operations for FEOL layer or structure fabrication may include standard microelectronic fabrication processes such as lithography, etch, thin films deposition, planarization (such as chemical mechanical polishing (CMP)), diffusion, metrology, the use of sacrificial layers, the use of etch stop layers, the use of planarization stop layers, or any other associated action with microelectronic component fabrication. Also, it is to be appreciated that the process operations described for the preceding process flows may be practiced in alternative sequences, not every operation need be performed or additional process operations may be performed, or both.

Embodiments disclosed herein may be used to manufacture a wide variety of different types of integrated circuits or microelectronic devices. Examples of such integrated circuits include, but are not limited to, processors, chipset components, graphics processors, digital signal processors, micro-controllers, and the like. In other embodiments, semiconductor memory may be manufactured. Moreover, the integrated circuits or other microelectronic devices may be used in a wide variety of electronic devices known in the arts. For example, in computer systems (e.g., desktop, laptop, server), cellular phones, personal electronics, etc. The integrated circuits may be coupled with a bus and other components in the systems. For example, a processor may be coupled by one or more buses to a memory, a chipset, etc. Each of the processor, the memory, and the chipset, may potentially be manufactured using the approaches disclosed herein.

Figure 9:
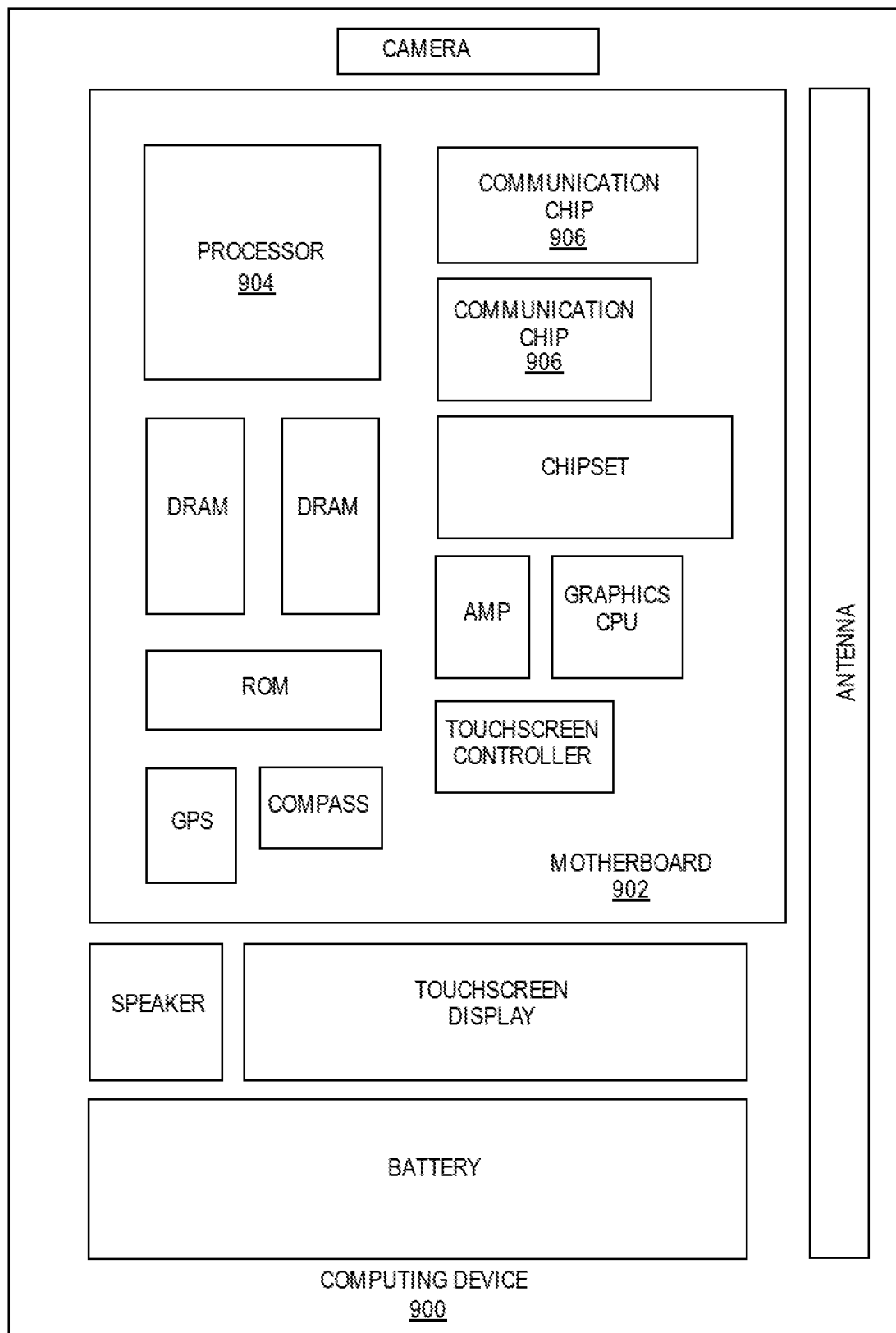
FIG. 9 illustrates a computing device in accordance with one implementation of the disclosure.

FIG. 9 illustrates a computing device 900 in accordance with one implementation of the disclosure. The computing device 900 houses a board 902. The board 902 may include a number of components, including but not limited to a processor 904 and at least one communication chip 906. The processor 904 is physically and electrically coupled to the board 902. In some implementations the at least one communication chip 906 is also physically and electrically coupled to the board 902. In further implementations, the communication chip 906 is part of the processor 904.

Depending on its applications, computing device 900 may include other components that may or may not be physically and electrically coupled to the board 902. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 906 enables wireless communications for the transfer of data to and from the computing device 900. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 906 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 900 may include a plurality of communication chips 906. For instance, a first communication chip 906 may be dedicated to shorter range wireless communications such as Wi-Fi and Bluetooth and a second communication chip 906 may be dedicated to longer range wireless communications such as GPS, EDGE, GPRS, CDMA, WiMAX, LTE, Ev-DO, and others.

The processor 904 of the computing device 900 includes an integrated circuit die packaged within the processor 904. In some implementations of embodiments of the disclosure, the integrated circuit die of the processor 904 includes one or more structures, such as integrated circuit structures built in accordance with implementations of the disclosure. The term "processor" may refer to any device or portion of a device that processes electronic data from registers or memory to transform that electronic data, or both, into other electronic data that may be stored in registers or memory, or both.

The communication chip 906 also includes an integrated circuit die packaged within the communication chip 906. In accordance with another implementation of the disclosure, the integrated circuit die of the communication chip 906 is built in accordance with implementations of the disclosure.

In further implementations, another component housed within the computing device 900 may contain an integrated circuit die built in accordance with implementations of embodiments of the disclosure.

In various embodiments, the computing device 900 may be a laptop, a netbook, a notebook, an ultrabook, a smartphone, a tablet, a personal digital assistant (PDA), an ultramobile PC, a mobile phone, a desktop computer, a server, a printer, a scanner, a monitor, a set-top box, an entertainment control unit, a digital camera, a portable music player, or a digital video recorder. In further implementations, the computing device 900 may be any other electronic device that processes data.

Figure 10:
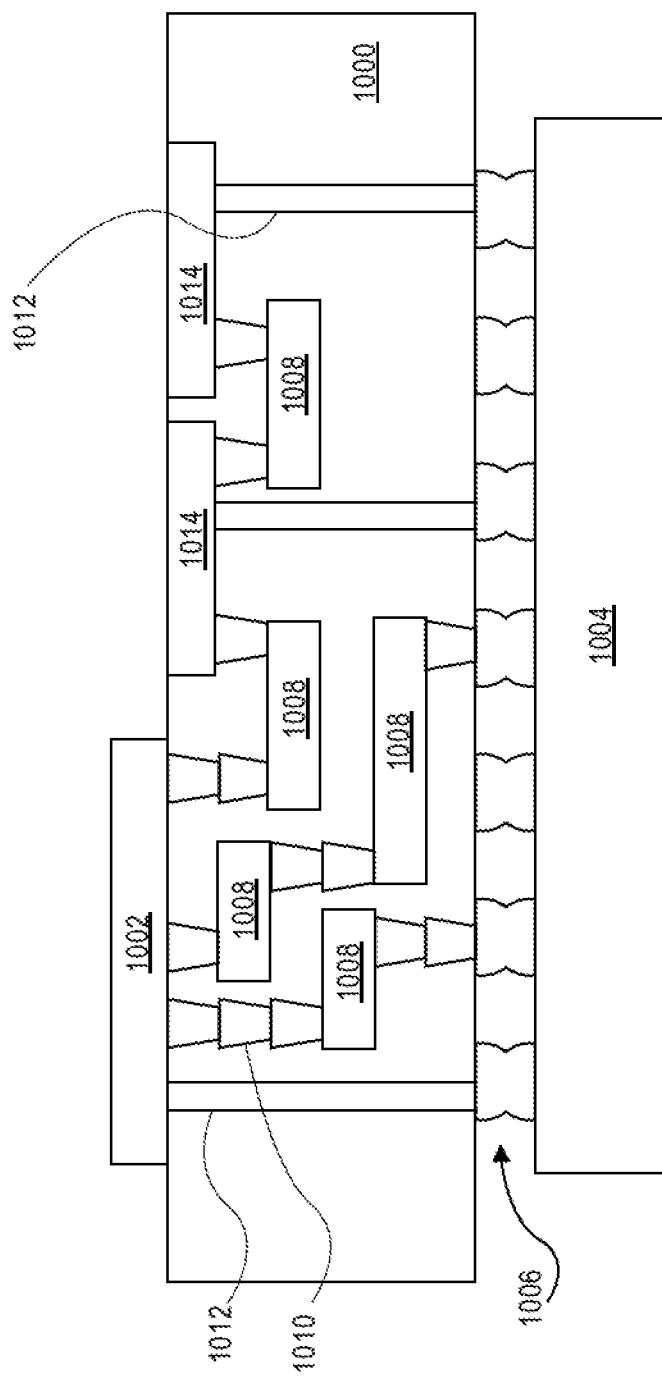
FIG. 10 illustrates an interposer that includes one or more embodiments of the disclosure.

FIG. 10 illustrates an interposer 1000 that includes one or more embodiments of the disclosure. The interposer 1000 is an intervening substrate used to bridge a first substrate 1002 to a second substrate 1004. The first substrate 1002 may be, for instance, an integrated circuit die. The second substrate 1004 may be, for instance, a memory module, a computer motherboard, or another integrated circuit die. Generally, the purpose of an interposer 1000 is to spread a connection to a wider pitch or to reroute a connection to a different connection. For example, an interposer 1000 may couple an integrated circuit die to a ball grid array (BGA) 1006 that can subsequently be coupled to the second substrate 1004. In some embodiments, the first and second substrates 1002/1004 are attached to opposing sides of the interposer 1000. In other embodiments, the first and second substrates 1002/1004 are attached to the same side of the interposer 1000. And, in further embodiments, three or more substrates are interconnected by way of the interposer 1000.

The interposer 1000 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

The interposer 1000 may include metal interconnects 1008 and vias 1010, including but not limited to through-silicon vias (TSVs) 1012. The interposer 1000 may further include embedded devices 1014, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 1000. In accordance with embodiments of the disclosure, apparatuses or processes disclosed herein may be used in the fabrication of interposer 1000 or in the fabrication of components included in the interposer 1000.

Figure 11:
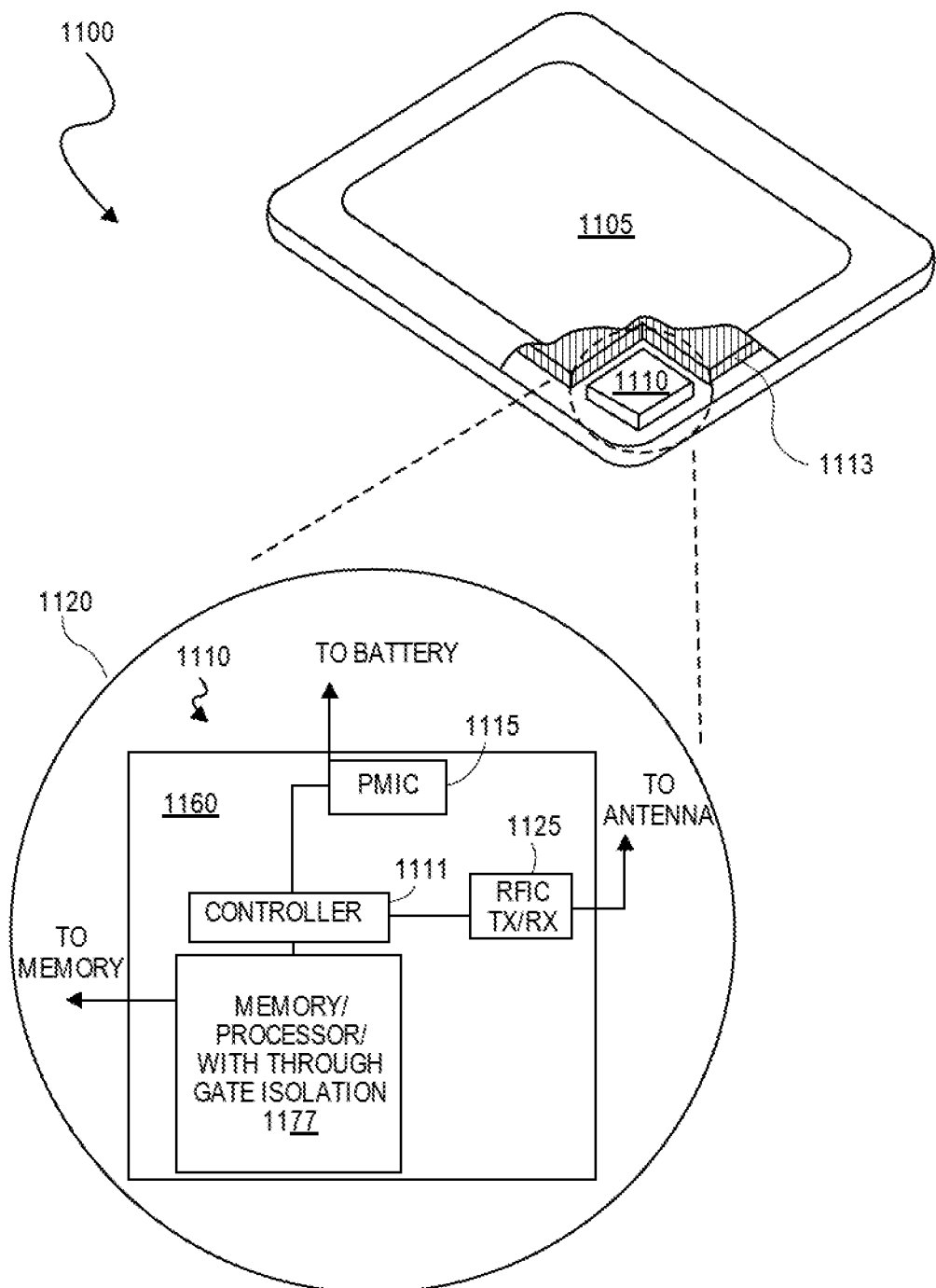
FIG. 11 is an isometric view of a mobile computing platform employing an IC fabricated according to one or more processes described herein or including one or more features described herein, in accordance with an embodiment of the present disclosure.

FIG. 11 is an isometric view of a mobile computing platform 1100 employing an integrated circuit (IC) fabricated according to one or more processes described herein or including one or more features described herein, in accordance with an embodiment of the present disclosure.

The mobile computing platform 1100 may be any portable device configured for each of electronic data display, electronic data processing, and wireless electronic data transmission. For example, mobile computing platform 1100 may be any of a tablet, a smart phone, laptop computer, etc. and includes a display screen 1105 which in the exemplary embodiment is a touchscreen (capacitive, inductive, resistive, etc.), a chip-level (SoC) or package-level integrated system 1110, and a battery 1113. As illustrated, the greater the level of integration in the integrated system 1110 enabled by higher transistor packing density, the greater the portion of the mobile computing platform 1100 that may be occupied by the battery 1113 or non-volatile storage, such as a solid state drive, or the greater the transistor gate count for improved platform functionality. Similarly, the greater the carrier mobility of each transistor in the integrated system 1110, the greater the functionality. As such, techniques described herein may enable performance and form factor improvements in the mobile computing platform 1100.

The integrated system 1110 is further illustrated in the expanded view 1120. In the exemplary embodiment, packaged device 1177 includes at least one memory chip (e.g., RAM), or at least one processor chip (e.g., a multi-core microprocessor and/or graphics processor) fabricated according to one or more processes described herein or including one or more features described herein. The packaged device 1177 is further coupled to the board 1160 along with one or more of a power management integrated circuit (PMIC) 1115, RF (wireless) integrated circuit (RFIC) 1125 including a wideband RF (wireless) transmitter and/or receiver (e.g., including a digital baseband and an analog front end module further includes a power amplifier on a transmit path and a low noise amplifier on a receive path), and a controller thereof 1111. Functionally, the PMIC 1115 performs battery power regulation, DC-to-DC conversion, etc., and so has an input coupled to the battery 1113 and with an output providing a current supply to all the other functional modules. As further illustrated, in the exemplary embodiment, the RFIC 1125 has an output coupled to an antenna to provide to implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. In alternative implementations, each of these board-level modules may be integrated onto separate ICs coupled to the package substrate of the packaged device 1177 or within a single IC (SoC) coupled to the package substrate of the packaged device 1177.

In another aspect, semiconductor packages are used for protecting an integrated circuit (IC) chip or die, and also to provide the die with an electrical interface to external circuitry. With the increasing demand for smaller electronic devices, semiconductor packages are designed to be even more compact and must support larger circuit density. Furthermore, the demand for higher performance devices results in a need for an improved semiconductor package that enables a thin packaging profile and low overall warpage compatible with subsequent assembly processing.

In an embodiment, wire bonding to a ceramic or organic package substrate is used. In another embodiment, a C4 process is used to mount a die to a ceramic or organic package substrate. In particular, C4 solder ball connections can be implemented to provide flip chip interconnections between semiconductor devices and substrates. A flip chip or Controlled Collapse Chip Connection (C4) is a type of mounting used for semiconductor devices, such as integrated circuit (IC) chips, MEMS or components, which utilizes solder bumps instead of wire bonds. The solder bumps are deposited on the C4 pads, located on the top side of the substrate package. In order to mount the semiconductor device to the substrate, it is flipped over with the active side facing down on the mounting area. The solder bumps are used to connect the semiconductor device directly to the substrate.

Figure 12:
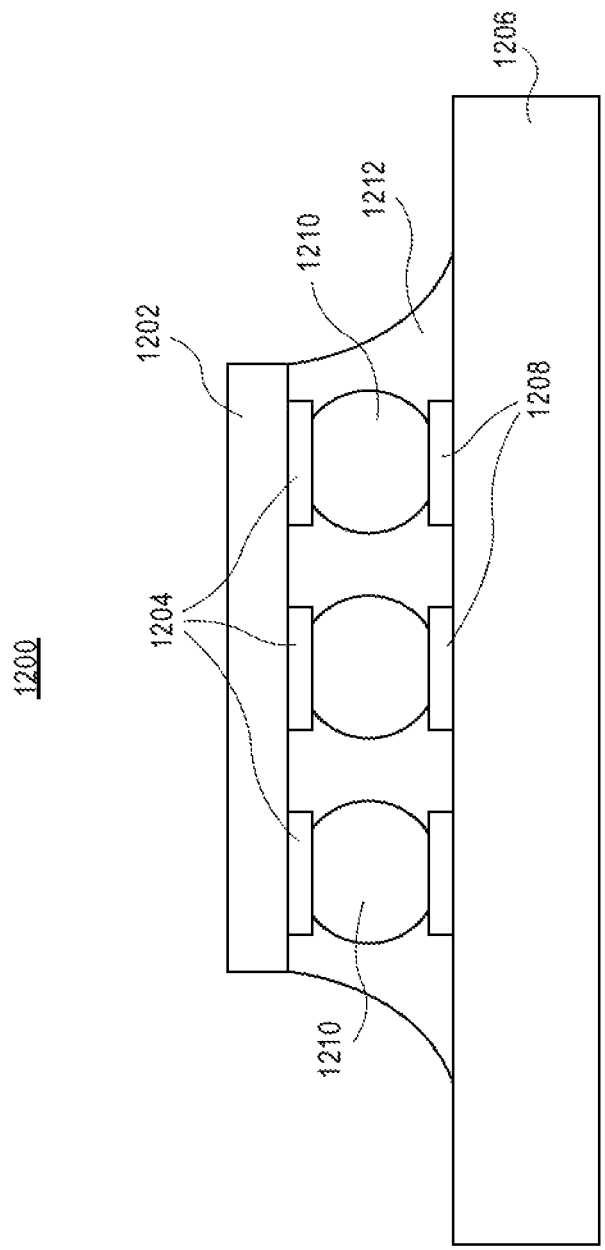
FIG. 12 illustrates a cross-sectional view of a flip-chip mounted die, in accordance with an embodiment of the present disclosure.

FIG. 12 illustrates a cross-sectional view of a flip-chip mounted die, in accordance with an embodiment of the present disclosure.

Referring to FIG. 12, an apparatus 1200 includes a die 1202 such as an integrated circuit (IC) fabricated according to one or more processes described herein or including one or more features described herein, in accordance with an embodiment of the present disclosure. The die 1202 includes metallized pads 1204 thereon. A package substrate 1206, such as a ceramic or organic substrate, includes connections 1208 thereon. The die 1202 and package substrate 1206 are electrically connected by solder balls 1210 coupled to the metallized pads 1204 and the connections 1208. An underfill material 1212 surrounds the solder balls 1210.

Processing a flip chip may be similar to conventional IC fabrication, with a few additional operations. Near the end of the manufacturing process, the attachment pads are metalized to make them more receptive to solder. This typically consists of several treatments. A small dot of solder is then deposited on each metalized pad. The chips are then cut out of the wafer as normal. To attach the flip chip into a circuit, the chip is inverted to bring the solder dots down onto connectors on the underlying electronics or circuit board. The solder is then re-melted to produce an electrical connection, typically using an ultrasonic or alternatively reflow solder process. This also leaves a small space between the chip's circuitry and the underlying mounting. In most cases an electrically-insulating adhesive is then "underfilled" to provide a stronger mechanical connection, provide a heat bridge, and to ensure the solder joints are not stressed due to differential heating of the chip and the rest of the system.

In other embodiments, newer packaging and die-to-die interconnect approaches, such as through silicon via (TSV) and silicon interposer, are implemented to fabricate high performance Multi-Chip Module (MCM) and System in Package (SiP) incorporating an integrated circuit (IC) fabricated according to one or more processes described herein or including one or more features described herein, in accordance with an embodiment of the present disclosure.

Thus, embodiments of the present disclosure include contact over active gate structures with metal oxide cap structures to inhibit shorting and methods of fabricating contact over active gate structures with metal oxide cap structures.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of the present disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of the present application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

The following examples pertain to further embodiments. The various features of the different embodiments may be variously combined with some features included and others excluded to suit a variety of different applications.

Example Embodiment 1

An integrated circuit structure includes a plurality of gate structures above substrate, each of the gate structures including a gate insulating layer thereon. A plurality of conductive trench contact structures is alternating with the plurality of gate structures, each of the conductive trench contact structures including a metal oxide cap structure thereon. An interlayer dielectric material is over the plurality of gate structures and over the plurality of conductive trench contact structures. An opening is in the interlayer dielectric material and in a gate insulating layer of a corresponding one of the plurality of gate structures. A conductive via is in the opening, the conductive via in direct contact with the corresponding one of the plurality of gate structures, and the conductive via on a portion of one or more of the metal oxide cap structures.

Example Embodiment 2

The integrated circuit structure of example embodiment 1, wherein each of the plurality of conductive trench contact structures includes a liner material and a fill material.

Example Embodiment 3

The integrated circuit structure of example embodiment 2, wherein the fill material is recessed below the liner material, and wherein the corresponding metal oxide cap structure is on the fill material, and the corresponding metal oxide cap structure is over the liner material but not directly on the liner material.

Example Embodiment 4

The integrated circuit structure of example embodiment 2, wherein the liner material is recessed below the fill material, and wherein the corresponding metal oxide cap structure is on the fill material and on the liner material.

Example Embodiment 5

The integrated circuit structure of example embodiment 1, 2, 3 or 4, further including a plurality of dielectric spacers alternating with the plurality of gate structures and the plurality of conductive trench contact structures.

Example Embodiment 6

The integrated circuit structure of example embodiment 5, wherein each of the metal oxide cap structures overhangs a portion of a corresponding one of the plurality of dielectric spacers.

Example Embodiment 7

The integrated circuit structure of example embodiment 1, 2, 3, 4, 5 or 6, wherein the metal oxide cap structures include a metal oxide layer selected from the group consisting of AlOx, HfOx, ZrOx, and TiOx.

Example Embodiment 8

The integrated circuit structure of example embodiment 1, 2, 3, 4, 5, 6 or 7, wherein the plurality of conductive trench contact structures and the plurality of gate structures are on a semiconductor fin.

Example Embodiment 9

An integrated circuit structure includes a plurality of gate structures above substrate, each of the gate structures including a gate insulating layer thereon. A plurality of conductive trench contact structures is alternating with the plurality of gate structures, each of the conductive trench contact structures including a metal oxide cap structure thereon. Each of the plurality of conductive trench contact structures includes a liner material and a fill material. A plurality of dielectric spacers is alternating with the plurality of gate structures and the plurality of conductive trench contact structures. The liner material and the fill material of each of the conductive trench contact structures are recessed below the plurality of dielectric spacers, and the corresponding metal oxide cap structure is on the fill material and on the liner material. An interlayer dielectric material is over the plurality of gate structures and over the plurality of conductive trench contact structures. An opening is in the interlayer dielectric material and in a gate insulating layer of a corresponding one of the plurality of gate structures. A conductive via is in the opening, the conductive via in direct contact with the corresponding one of the plurality of gate structures, and the conductive via on a portion of one or more of the metal oxide cap structures.

Example Embodiment 10

The integrated circuit structure of example embodiment 9, wherein the metal oxide cap structures include a metal oxide layer selected from the group consisting of AlOx, HfOx, ZrOx, and TiOx.

Example Embodiment 11

The integrated circuit structure of example embodiment 9 or 10, wherein the plurality of conductive trench contact structures and the plurality of gate structures are on a semiconductor fin.

Example Embodiment 12

A computing device includes a board and a component coupled to the board. The component includes an integrated circuit structure. The integrated circuit structure includes a plurality of gate structures above substrate, each of the gate structures including a gate insulating layer thereon. A plurality of conductive trench contact structures is alternating with the plurality of gate structures, each of the conductive trench contact structures including a metal oxide cap structure thereon. An interlayer dielectric material is over the plurality of gate structures and over the plurality of conductive trench contact structures. An opening is in the interlayer dielectric material and in a gate insulating layer of a corresponding one of the plurality of gate structures. A conductive via is in the opening, the conductive via in direct contact with the corresponding one of the plurality of gate structures, and the conductive via on a portion of one or more of the metal oxide cap structures.

Example Embodiment 13

The computing device of example embodiment 12, further including a memory coupled to the board.

Example Embodiment 14

The computing device of example embodiment 12 or 13, further including a communication chip coupled to the board.

Example Embodiment 15

The computing device of example embodiment 12, 13 or 14, further including a camera coupled to the board.

Example Embodiment 16

The computing device of example embodiment 12, 13, 14 or 15, further including a battery coupled to the board.

Example Embodiment 17

The computing device of example embodiment 12, 13, 14, 15 or 16, further including an antenna coupled to the board.

Example Embodiment 18

The computing device of example embodiment 12, 13, 14, 15, 16 or 17, wherein the component is a packaged integrated circuit die.

Example Embodiment 19

The computing device of example embodiment 12, 13, 14, 15, 16, 17 or 18, wherein the component is selected from the group consisting of a processor, a communications chip, and a digital signal processor.

Example Embodiment 20

The computing device of example embodiment 12, 13, 14, 15, 16, 17, 18 or 19, wherein the computing device is selected from the group consisting of a mobile phone, a laptop, a desk top computer, a server, and a set-top box.

What is claimed is:

1. An integrated circuit structure, comprising:
   a plurality of gate structures above substrate, each of the gate structures including a gate insulating layer thereon, the gate insulating layer having an uppermost surface;
   a plurality of conductive trench contact structures alternating with the plurality of gate structures, each of the conductive trench contact structures including a metal oxide cap structure thereon, the metal oxide cap structure having an uppermost surface above the uppermost surface of the gate insulating layer;
   a plurality of dielectric spacers alternating with the plurality of gate structures and the plurality of conductive trench contact structures, wherein an uppermost surface of the plurality of dielectric spacers is at a same level as an uppermost surface of the plurality of conductive trench contact structures;
   an interlayer dielectric material over the plurality of gate structures and over the plurality of conductive trench contact structures;
   an opening in the interlayer dielectric material and in a gate insulating layer of a corresponding one of the plurality of gate structures; and
   a conductive via in the opening, the conductive via in direct contact with the corresponding one of the plurality of gate structures, and the conductive via on a portion of one or more of the metal oxide cap structures.

2. The integrated circuit structure of claim 1, wherein each of the plurality of conductive trench contact structures comprises a liner material and a fill material.

3. The integrated circuit structure of claim 2, wherein the fill material is recessed below the liner material, and wherein the corresponding metal oxide cap structure is on the fill material, and the corresponding metal oxide cap structure is over the liner material but not directly on the liner material.

4. The integrated circuit structure of claim 2, wherein the liner material is recessed below the fill material, and wherein the corresponding metal oxide cap structure is on the fill material and on the liner material.

5. The integrated circuit structure of claim 1, wherein each of the metal oxide cap structures overhangs a portion of a corresponding one of the plurality of dielectric spacers.

6. The integrated circuit structure of claim 1, wherein the metal oxide cap structures comprise a metal oxide layer selected from the group consisting of AlOx, HfOx, ZrOx, and TiOx.

7. The integrated circuit structure of claim 1, wherein the plurality of conductive trench contact structures and the plurality of gate structures are on a semiconductor fin.

8. An integrated circuit structure, comprising:
   a plurality of gate structures above substrate, each of the gate structures including a gate insulating layer thereon, the gate insulating layer having an uppermost surface;
   a plurality of conductive trench contact structures alternating with the plurality of gate structures, each of the conductive trench contact structures including a metal oxide cap structure thereon, the metal oxide cap structure having an uppermost surface above the uppermost surface of the gate insulating layer, wherein each of the plurality of conductive trench contact structures comprises a liner material and a fill material;
   a plurality of dielectric spacers alternating with the plurality of gate structures and the plurality of conductive trench contact structures, wherein the liner material and the fill material of each of the conductive trench contact structures are recessed below the plurality of dielectric spacers, and wherein the corresponding metal oxide cap structure is on the fill material and on the liner material, and wherein an uppermost surface of the plurality of dielectric spacers is at a same level as an uppermost surface of the plurality of conductive trench contact structures;
   an interlayer dielectric material over the plurality of gate structures and over the plurality of conductive trench contact structures;
   an opening in the interlayer dielectric material and in a gate insulating layer of a corresponding one of the plurality of gate structures; and
   a conductive via in the opening, the conductive via in direct contact with the corresponding one of the plurality of gate structures, and the conductive via on a portion of one or more of the metal oxide cap structures.

9. The integrated circuit structure of claim 8, wherein the metal oxide cap structures comprise a metal oxide layer selected from the group consisting of AlOx, HfOx, ZrOx, and TiOx.

10. The integrated circuit structure of claim 8, wherein the plurality of conductive trench contact structures and the plurality of gate structures are on a semiconductor fin.

11. A computing device, comprising:
   a board; and
   a component coupled to the board, the component including an integrated circuit structure, comprising:

a plurality of gate structures above substrate, each of the gate structures including a gate insulating layer thereon, the gate insulating layer having an uppermost surface;

a plurality of conductive trench contact structures alternating with the plurality of gate structures, each of the conductive trench contact structures including a metal oxide cap structure thereon, the metal oxide cap structure having an uppermost surface above the uppermost surface of the gate insulating layer;

a plurality of dielectric spacers alternating with the plurality of gate structures and the plurality of conductive trench contact structures, wherein an uppermost surface of the plurality of dielectric spacers is at a same level as an uppermost surface of the plurality of conductive trench contact structures;

an interlayer dielectric material over the plurality of gate structures and over the plurality of conductive trench contact structures;

an opening in the interlayer dielectric material and in a gate insulating layer of a corresponding one of the plurality of gate structures; and a conductive via in the opening, the conductive via in direct contact with the corresponding one of the plurality of gate structures, and the conductive via on a portion of one or more of the metal oxide cap structures.

12. The computing device of claim 11, further comprising:

a memory coupled to the board.

13. The computing device of claim 11, further comprising:

a communication chip coupled to the board.

14. The computing device of claim 11, further comprising:

a camera coupled to the board.

15. The computing device of claim 11, further comprising:

a battery coupled to the board.

16. The computing device of claim 11, further comprising:

an antenna coupled to the board.

17. The computing device of claim 11, wherein the component is a packaged integrated circuit die.

18. The computing device of claim 11, wherein the component is selected from the group consisting of a processor, a communications chip, and a digital signal processor.

19. The computing device of claim 11, wherein the computing device is selected from the group consisting of a mobile phone, a laptop, a desk top computer, a server, and a set-top box.

* * * * *